(12) United States Patent
Maturana et al.

(10) Patent No.: US 11,687,493 B1
(45) Date of Patent: Jun. 27, 2023

(54) PROCESS RECIPE DIGITAL TWIN STRUCTURING

(71) Applicant: Rockwell Automation Technologies, Inc., Mayfield Heights, OH (US)

(72) Inventors: Francisco P. Maturana, Lyndhurst, OH (US); Sachin Misra, Lakeway, TX (US); Brian Taylor, Oshkosh, WI (US); Dennis J Luo, Germantown, WI (US); Jay W Schiele, Union Grove, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/682,737

(22) Filed: Feb. 28, 2022

(51) Int. Cl.
*G06F 16/176* (2019.01)
*H04L 67/06* (2022.01)
*G06F 3/0482* (2013.01)
*G06F 30/20* (2020.01)

(52) U.S. Cl.
CPC .......... *G06F 16/176* (2019.01); *G06F 3/0482* (2013.01); *G06F 30/20* (2020.01); *H04L 67/06* (2013.01)

(58) Field of Classification Search
CPC ...... G06F 16/176; G06F 3/0482; G06F 30/20; H04L 67/06
See application file for complete search history.

(56) References Cited

U.S. PATENT DOCUMENTS

| | | | |
|---|---|---|---|
| 7,831,317 | B2 | 11/2010 | McGreevy et al. |
| 10,885,087 | B2 | 1/2021 | Rodrigues De Oliveira et al. |
| 2006/0072144 | A1* | 4/2006 | Dowling ............... G06F 21/606 358/1.15 |
| 2011/0271179 | A1 | 11/2011 | Jasko et al. |
| 2020/0012265 | A1* | 1/2020 | Thomsen .............. G06F 3/0481 |
| 2022/0027529 | A1* | 1/2022 | Zarur ................. G05B 19/4189 |
| 2022/0197231 | A1* | 6/2022 | Kim ................... G05B 23/0254 |
| 2022/0309078 | A1 | 9/2022 | Fujii |
| 2022/0366494 | A1* | 11/2022 | Cella ................. G06Q 30/0201 |

OTHER PUBLICATIONS

Non-Final Office Action received for U.S. Appl. No. 17/682,638, dated Mar. 13, 2023, 34 pages.

* cited by examiner

*Primary Examiner* — El Hadji M Sall
(74) *Attorney, Agent, or Firm* — Amin, Turocy & Waston, LLP

(57) ABSTRACT

A digital technology transfer system transforms technology transfer documents to a set of digitized manufacturing procedures and operations documentation. The system can transform a technology transfer document to a hierarchical structured model representing a package, or product to be manufactured, and the process for manufacturing the product. The resulting package model can be integrated into a larger model representing an ecosystem of manufacturing entities and plant facilities by assigning steps of the manufacturing process to one or more selected production lines. The system allows participants in the ecosystem to browse the hierarchical model to view information about the manufacturing entities, their plant facilities, and the packages assigned to the respective facilities. The system offers filtered role-specific views of the technology transfer documents, their approval statuses, and their plant assignments.

20 Claims, 38 Drawing Sheets

Dashboard    Navigate    Settings ▶

Settings / Company / Add New Company

Company Information  Users

Company
[GKG123]

Status
[Active ▶]

DUNS Number
[99889877]

Location
[33.9825911, -118.273077 ▶]

Web URL
[GKG.com]

Phone
[5559798798]

State
[California ▶]

City
[Lake San Marcos ▶]

Zipcode
[8909907]

Country
[United States ▶]

— 504

[CANCEL]  [SUBMIT]

Settings / Manufacturer / Add New Manufacturer

Manufacturer Information  Users

Company
[Pharma 1 ▶] ← 606

| Manufacturer Name | Manufacturer Type | Status | DUNS Number |
| Manufacturer 19 | Type 1 ▶ | Active ▶ | 1 |

Location | Web URL | Phone | Country
Mumbai | www | 9487012964 | Afghanistan ▶

State | City | Zipcode
Select State ▶ | Select City ▶ | 690-519

[CANCEL]  [SUBMIT] ← 604

Settings / User Roles / Add User Roles

User Role Name: Pharma Innovator – Viewer

Description: 3 Pharma Innovator Viewer

Access Permissions

Create ○ Can create Manufacturer
Edit ○ Can make changes to Manufacturer
Delete ○ Can delete Manufacturer ▼ Plant
View ● Can view Plant, but can't modify
Create ○ Can create Plant
Edit ○ Can make changes to Plant
Delete ○ Can delete Plant ▼ Users
View ● Can view Users, but can't modify
Create ○ Can create Users
Edit ○ Can make changes to Users
Delete ○ Can delete Users

[SUBMIT] [CANCEL]

FIG. 8b

Settings / User Roles

| User Role | Description | Created On | Created By | |
|---|---|---|---|---|
| Pharma Innovator - Viewer | 3 Pharma Innovator - Viewer | 11/17/2021 | SaaS administrator | |
| CDMO - Viewer | 5 CDMO Viewer | 11/17/2021 | SaaS administrator | |
| CDMO - Viewer | 4 CDMO Viewer | 11/17/2021 | SaaS administrator | |
| Pharma Innovator - Creator | 3 Pharma Innovator - Creator | 11/17/2021 | SaaS administrator | |
| Administrator | 1 Administrator | 11/17/2021 | SaaS administrator | |
| Reviewer | Dttp Reviewer | 11/17/2021 | SaaS administrator | |

Dashboard  Navigate  Settings ▶

Settings / User / Add New User

| User Name | First Name | Last Name |
| CDMO - V | CDMO | Viewer |

| | | Email |
| | | cdmov@123.com |

| Phone | User Role | Country |
| 9988766778 | CDMO - Viewer ▶ | Australia ▶ |

| | | State |
| | | South Australia ▶ |

| City | Zip Code | |
| Athol Park ▶ | 668533 | |

Send Text Notification
○

SUBMIT   CANCEL 1002 (screen)
1004 (arrow)

FIG. 19

PROCESS RECIPE DIGITAL TWIN STRUCTURING

BACKGROUND

The subject matter disclosed herein relates generally to industrial data sharing, and, for example, to distribution of technology transfer documents.

BRIEF DESCRIPTION

The following presents a simplified summary in order to provide a basic understanding of some aspects described herein. This summary is not an extensive overview nor is it intended to identify key/critical elements or to delineate the scope of the various aspects described herein. Its sole purpose is to present some concepts in a simplified form as a prelude to the more detailed description that is presented later.

In one or more embodiments, a system is provided, comprising user interface component configured to import a technology transfer document containing information about a product to be manufactured and describing a manufacturing process for manufacturing the product; a conversion component configured to translate the technology transfer document to a package model, the package model comprising a hierarchically structured organization of nodes representing content sections of the technology transfer document; a digital twin generator component configured to generate a digital twin of the manufacturing process based on information contained in the package model; and a simulation component configured to execute a simulation of the manufacturing process based on the digital twin and to generate simulation result data indicating results of the simulation.

Also, one or more embodiments provide a method, comprising importing, by a system comprising a processor, a technology transfer document containing information about a product to be manufactured and describing a manufacturing process for manufacturing the product; converting, by the system, the technology transfer document to a package model, the package model comprising a hierarchically structured organization of objects representing content sections of the technology transfer document; generating, by the system, a digital twin of the manufacturing process based on information contained in the package model; executing, by the system, a simulation of the manufacturing process based on the digital twin; and generating, by the system, simulation result data indicating results of the simulation.

Also, according to one or more embodiments, a non-transitory computer-readable medium is provided having stored thereon instructions that, in response to execution, cause a technology transfer system comprising a processor to perform operations, the operations comprising importing a technology transfer document comprising information describing a product to be manufactured and a manufacturing process for manufacturing the product; translating the technology transfer document to a package model, wherein the package model comprises a hierarchically structured organization of nodes representing content sections of the technology transfer document; generating a digital twin of the manufacturing process based on information contained in the package model; executing a simulation of the manufacturing process based on the digital twin.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 5 is an example company definition display that can be used to submit information about a technology owner for which an innovator model is being built.

FIG. 6 is an example manufacturer definition display that can be used to submit information about a manufacturing entity to be associated with a technology owner.

FIG. 8b is a second view of the example user role definition interface that can be used to define user roles and their associated permissions.

FIG. 9 is an example user role summary screen that lists user roles registered with the technology transfer system.

FIG. 10 is an example user definition display that can be used to register new users with the technology transfer system.

FIG. 12a is a first segment of an example technology transfer document.

FIG. 18 is a view of the dashboard interface in which a section of a package has been selected for review.

FIG. 19 is a view of the dashboard interface when one of the stage nodes is selected.

DETAILED DESCRIPTION

Figure 1:
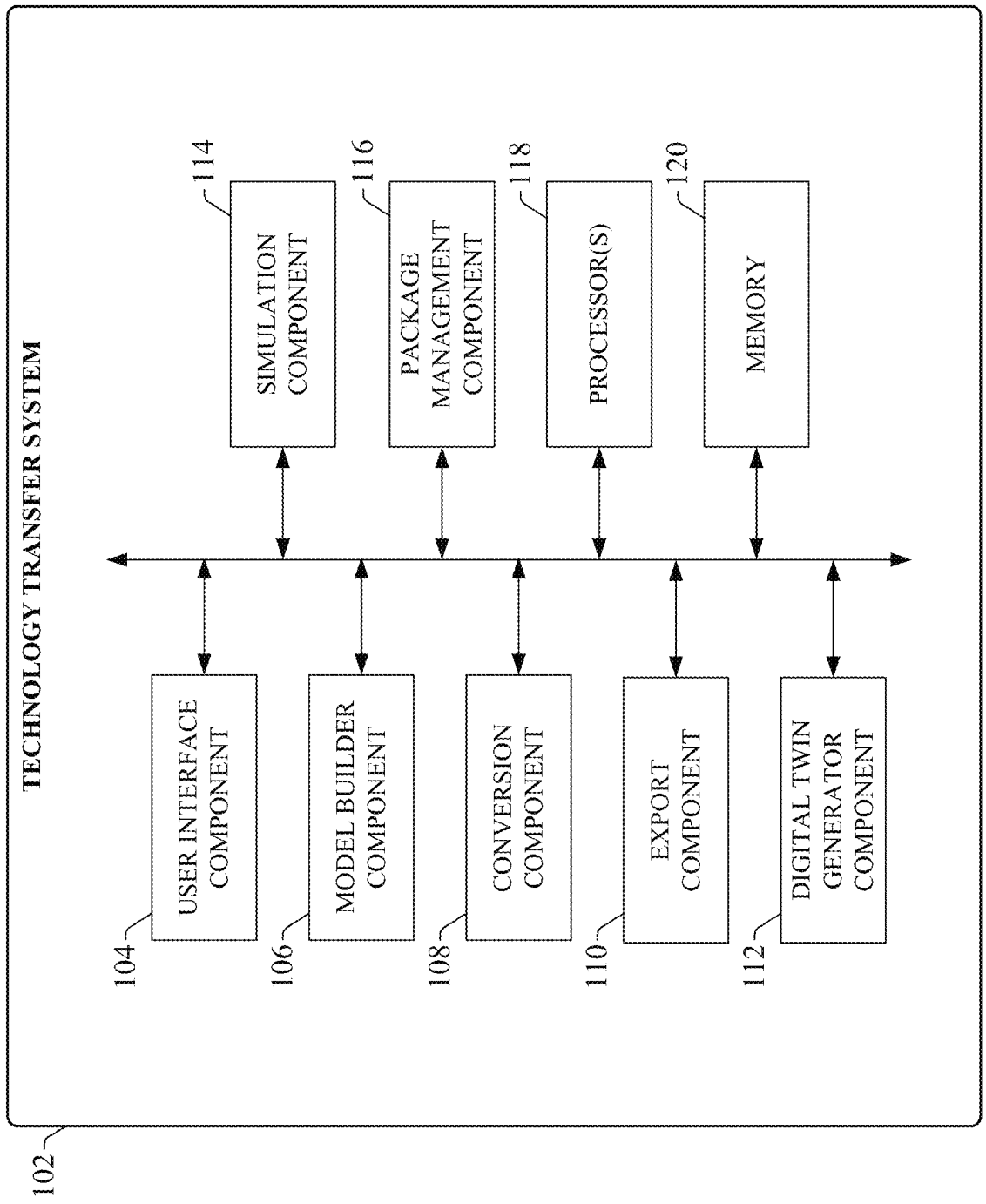
FIG. 1 is a block diagram of an example technology transfer system according to one or more embodiments of this disclosure.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers, including cloud-based computing systems. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Technology owners in some industrial verticals often distribute the specifics of their technical innovations to partners or third-party entities for manufacture using a protocol known as technology transfer. In an example technology transfer scenario, a pharmaceutical company that holds ownership of the manufacturing details of a pharmaceutical product can send these details, in the form of a technology transfer document, to partner manufacturing entities, who use these documents as an instructional guide for producing the product. These technology transfer documents are typically written in a structured natural language format and include such information as a summary of the product, descriptions of the steps of the industrial process for manufacturing the product, and control parameters for the industrial process. As part of the manufacturing process description, these technology transfer documents may also include data formatted as charts, tables, or other documentation.

There are a number of inefficiencies in the manner in which these technical documents are exchanged between entities. For example, because of the asynchronous approval and editing process, whereby multiple managers and engineers may submit review feedback or edits to the document in parallel, there may be multiple different versions of a given document in circulation before the finalized document is approved for deployment and implementation. Tracking these different versions of the technical document can be difficult and may result in the loss of information. Moreover, the absence of a formalized approval collection process can make collection of document approvals difficult. Distribution of finalized technology transfer documents and implementation of the documented manufacturing processes at the manufacturing facilities can also benefit from a greater degree of digital formalization of the technology transfer process.

To address these and other issues, one or more embodiments described herein provide a digital technology transfer system capable of transforming technology transfer documents to a set of digitized manufacturing procedures and operations documentation. To this end, the technology transfer system can transform a technology transfer document to a hierarchical structured model representing a package, or product to be manufactured, and the process for manufacturing the product. The resulting package model can then be integrated into a larger model representing an ecosystem of manufacturing entities by assigning steps of the manufacturing process to one or more selected production lines. User interface features allow participants in the ecosystem to browse the resulting hierarchical model and view information about the manufacturing entities, their plant facilities, and the packages assigned to the respective facilities. The system offers filtered role-specific views of the technology transfer documents, their approval statuses, and their plant assignments. In some embodiments, the system can also translate portions of the package model to control configuration data that can be exported to industrial systems and devices to facilitate configuring those systems and devices to manufacture the product represented by the package model.

FIG. 1 is a block diagram of an example technology transfer system 102 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Technology transfer system 102 can include a user interface component 104, a model builder component 106, a conversion component 108, an export component 110, a digital twin generator component 112, a simulation component 114, a package management component 116, one or more processors 118, and memory 120. In various embodiments, one or more of the user interface component 104, model builder component 106, conversion component 108, export component 110, digital twin generator component 112, simulation component 114, package management component 116, the one or more processors 118, and memory 120 can be electrically and/or communicatively coupled to one another to perform one or more of the functions of the technology transfer system 102. In some embodiments, components 104, 106, 108, 110, 112, 114, and 116 can comprise software instructions stored on memory 120 and executed by processor(s) 118. Technology transfer system 102 may also interact with other hardware and/or software components not depicted in FIG. 1. For example, processor(s) 118 may interact with one or more external user interface devices, such as a keyboard, a mouse, a display monitor, a touchscreen, a smart phone, a tablet computer, an AR/VR wearable appliance, or other such interface devices.

User interface component 104 can be configured to receive user input and to render output to a user in any suitable format (e.g., visual, audio, tactile, etc.). In some embodiments, user interface component 104 can render interactive interface displays on a display device (e.g., a display device associated with a desktop computer, a laptop computer, a tablet computer, a smart phone, etc.), where the interface displays serve as the interface for the technology transfer system 102. The user interface component 104 can render various interface displays and associated tools that allow a user to build a hierarchical innovator model describing an ecosystem of manufacturing entities and their locations and capabilities; submit a technology transfer document (e.g., a portable document format (PDF) document) and assign manufacturing processes described in the document to selected manufacturing entities; view and submit document review statuses; browse technology packages that have been submitted to the system; and other such interface functions.

Model builder component 106 can be configured to generate a digital hierarchical innovator model comprising nodes representing manufacturing entities or other partner entities associated with a technology owner (e.g., a pharmaceutical company or other innovator), as well as the capabilities and manufacturing lines associated with the respective entities. The model builder component 106 can also define users, user roles, and access permissions for users permitted to view and interact with this innovator model.

Conversion component 108 can be configured to covert a digital technology transfer document from a native format (e.g., a PDF format or other natural language format) to a digital hierarchical package model comprising nodes representing the various process stages, steps, and parameters described in the document. The conversion component 108 also assigns relevant portions of the document—including text-based process descriptions, charts, tables, and process parameters—to the respective nodes of the package model. The conversion component 108 can also integrated the resulting document model into the larger innovator model based on defined assignments of manufacturing processes or steps to respective production lines operated by the manufacturing entities.

Export component 110 can be configured to export selected information contained in the digitized technology transfer document to external systems, including but not limited to manufacturing execution systems (MES) that monitor and manage control operations on the control level, enterprise resource planning (ERP) systems that integrate and collectively manage high-level business operations, industrial controllers that monitor and control industrial machines and processes at the plant level, or other such systems or devices. In some embodiments, the export component 110 can export control configuration data that configures respective industrial devices or systems to execute steps of the manufacturing process described in the technology transfer document.

Digital twin generator component 112 can be configured to generate a digital twin of a product manufacturing process based on information about the process and its associated production lines obtained from the hierarchical models. Simulation component 114 can be configured to simulate, based on the digital twin, manufacture of the product on designated production lines in accordance with the processes described in the technology transfer document. Package management component 116 can be configured to collect and manage approval statuses for the package and, in some embodiments, register content of the package model in a blockchain in a secure an immutable manner.

The one or more processors 118 can perform one or more of the functions described herein with reference to the systems and/or methods disclosed. Memory 120 can be a computer-readable storage medium storing computer-executable instructions and/or information for performing the functions described herein with reference to the systems and/or methods disclosed.

Figure 2:
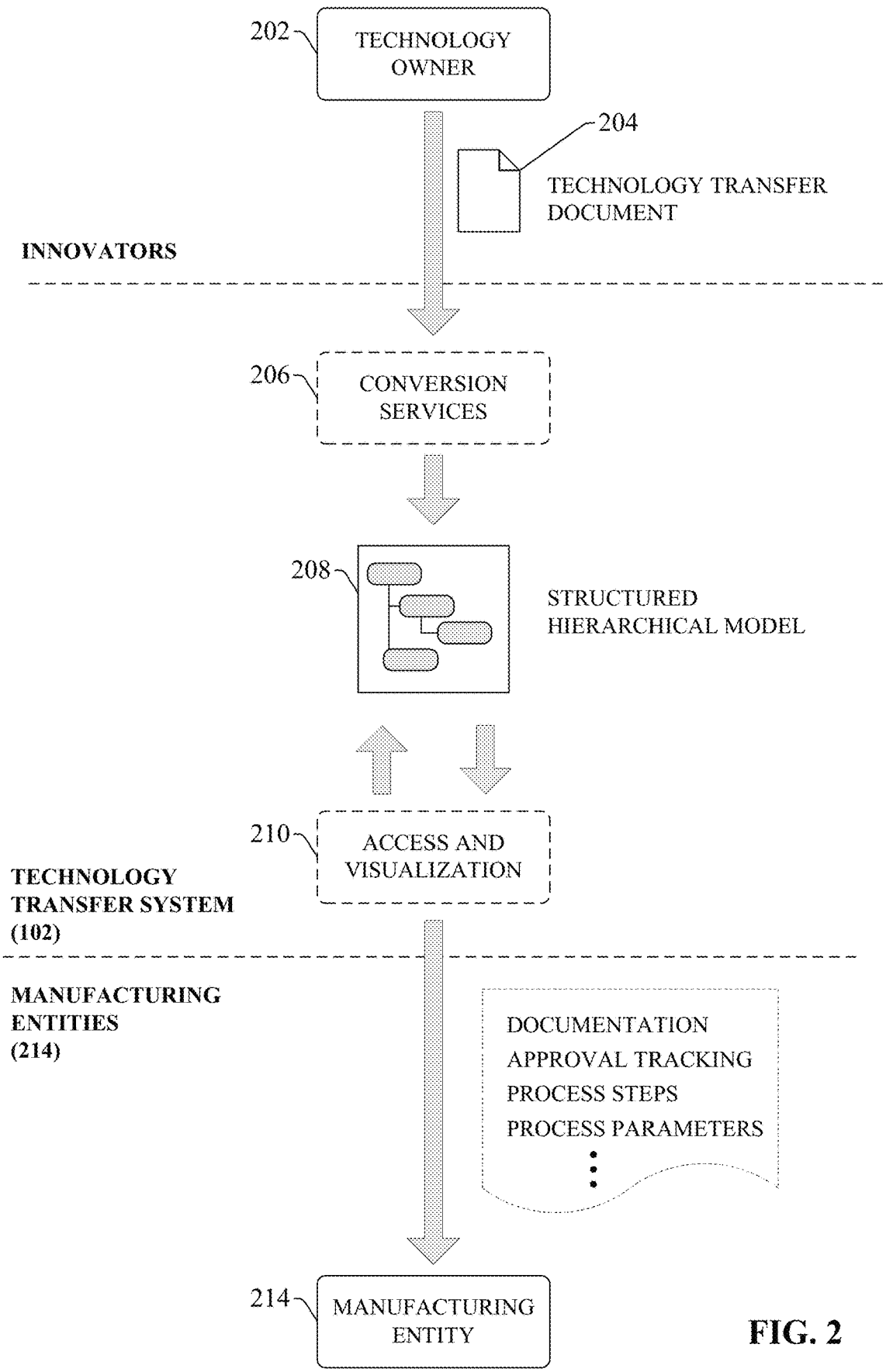
FIG. 2 is a diagram illustrating an example flow of technology documentation from a technology owner to a manufacturing entity using embodiments of the technology transfer system.

FIG. 2 is a diagram illustrating an example flow of technology documentation from a technology owner 202 to a manufacturing entity 214 using embodiments of the technology transfer system 102. Although the examples illustrated and described herein depict the use of system 102 to manage pharmaceutical technology data, the technology transfer system 102 can be used to manage transfer of technology within the context of substantially any industrial vertical, including but not limited to automotive, food and drug, textiles, oil and gas, or other verticals.

The technology transfer system 102 can be implemented on any suitable high-level system or platform accessible to the participants involved in the technology transfer. For example, in some embodiments the system 102 can be implemented as a set of cloud-based services on a cloud platform using a software-as-a-service (SaaS) model. In other embodiments, the system 102 may be implemented on one or more servers accessible to authorized users via a public and/or private network.

In general, the technology transfer system 102 supports digitalization of pharmaceutical manufacturing procedures and operational documentation provided in a natural language format, such as a PDF document or another type of natural language document format. The system 102 serves as a hub that allows technology owners 202 to transfer technical documents relating to a product to manufacturing entities 214, such as contract development and manufacturing organizations (CDMOs), thus acting as a bridge between technology owners and the manufacturers that will be producing physical instances of the technology.

A technology owner 202, such as a pharmaceutical company, can create a technology transfer document 204 describing specifics of a technology transfer package. The technology document 204 can describe a product to be manufactured (e.g., a pharmaceutical product) as well as manufacturing details for producing the product. Document 204 can be formatted as a combination of natural language and, if appropriate, other informational structures including but not limited to charts, tables, or graphs. In some scenarios, the document 204 can comprise a digital PDF file. However, other file formats for document 204 are also within the scope of one or more embodiments, including but not limited to word processing documents or image documents.

When the technology owner 202 submits the document 204 to the technology transfer system 102, conversion services 206 supported by the system 102 perform natural language processing on the document 204 to identify content sections contained in the document, including but not limited to product summaries, descriptions of stages of a manufacturing process, descriptions of process steps that make up the respective stages, process parameters associated with steps of the manufacturing stages, tables, charts, or other such elements. The conversion services 206 translate these discovered document elements to a hierarchical model 208 having a tree-like structure that conforms to a relevant industrial standard such as ISA-88.

Once the model 208 is created, access and visualization services 210 supported by the system 102 allow manufacturing entities 214, such as CDMOs, to view and interact with the organized document elements encoded in the model 208. These services 210 support workflows for viewing and editing the document data through interaction with the model 208 in accordance with role-specific access permissions. The system 102 also includes approval tracking tools that collect and track document approvals from authorized users who are part of the approval chain. In some embodiments, product recipe data obtained from the document 204 and integrated into the model 208 can be exported to manufacturing or control systems—e.g., MES or ERP systems—associated with relevant manufacturing entities 214.

Figure 3:
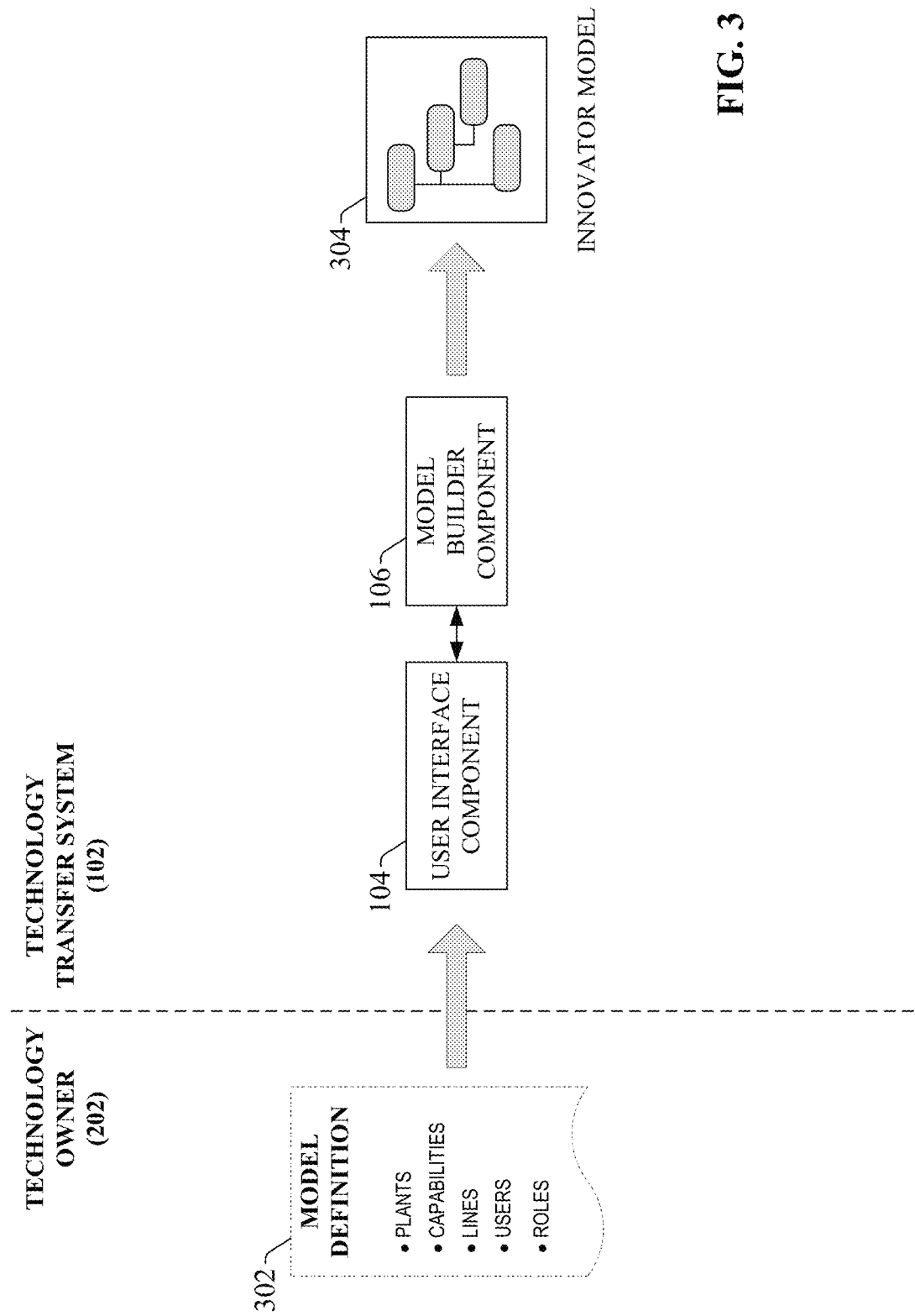
FIG. 3 is a diagram illustrating creation of an innovator model by the technology transfer system.

Prior to distribution of technology documents 204, the technology transfer system 102 allows a technology owner 202 to create an innovator model that represents the various manufacturing entities 214 who have a business relationship with the technology owner 202, as well as the capabilities, users, and access permissions associated with those manufacturing entities 214. FIG. 3 is a diagram illustrating creation of an innovator model 304 by the technology transfer system 102. In an example scenario, a technology owner 202, such as a pharmaceutical company that develops drug formulations, contracts with multiple manufacturing entities 214 to manufacture pharmaceutical products (e.g., topical or oral medications). To facilitate translation and distribution of technology transfer documents 204 to these manufacturing entities 214, tools supported by the system 102 allow an administrator associated with the technology owner 202 (or innovator) to create an innovator model 304 that represents these various manufacturing entities and their respective capabilities as a hierarchical structure of nodes.

Figure 4:
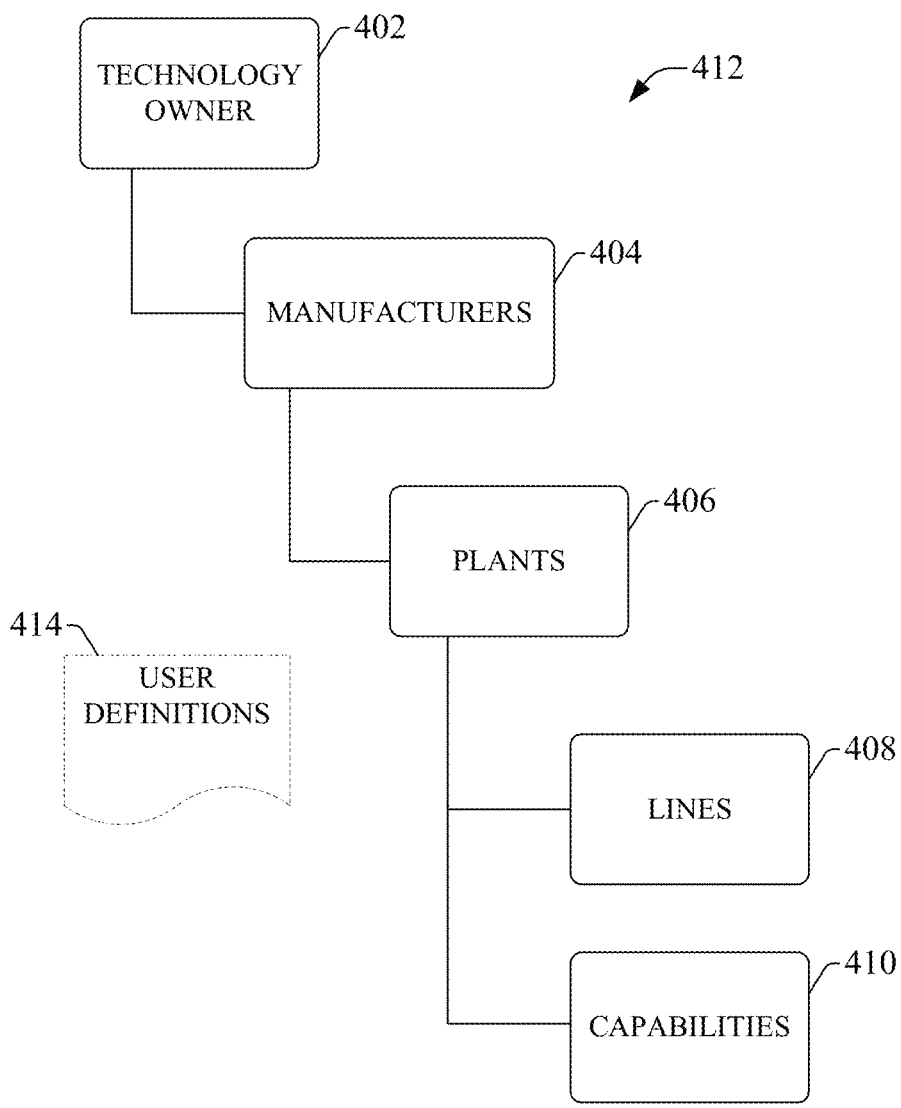
FIG. 4 is an example hierarchical schema for an innovator model.

To this end, the user interface component 104 can render configuration interface displays on an authorized user's client device that allow the user to submit model definition information 302 describing the entities to be represented by the model 304. The model builder component 106 then uses this model definition input 302 to create the innovator model 304. The format of innovator model 304 can conform to any suitable hierarchical schema depicting relationships between the technology owner 202, the manufacturing entities 214, and the respective plant facilities associated with the manufacturing entities 214. FIG. 4 is an example hierarchical schema 412 for the innovator model 304 according to one or more embodiments. In this example, the technology owner is represented by the highest level 402 of the schema. Since the innovator model 304 is specific to a given technology owner 202 in this scenario, there is only one such technology owner node in this example. In some embodiments, the model builder component 106 can enforce conformance of the innovator model 304 with an industrial standard, such as ISA-88.

Below the technology owner level 402, a manufacturers level 404 comprises one or more manufacturer nodes representing manufacturing entities 214 employed by the technology owner 202 to manufacture products in accordance with the formulations described in the technology transfer documents 204. Each manufacturer node is associated with one or more plant nodes defined in a plant level 406. The plant nodes are defined as child nodes of the plant nodes and represent the plant facilities owned by the manufacturer and available to manufacture product. The production lines and manufacturing capabilities of each plant are defined under a line level 408 and a capability level 410, respectively, which reside under the plant level 406. It is to be appreciated that the hierarchical schema 412 depicted in FIG. 4 is only intended to be exemplary, and that innovator model 304 can conform to any suitable schema in which the manufacturers and their plant facilities are represented. As will be described in more detail herein, information contained in technology transfer documents 204 submitted to the system 102 will be translated and integrated into this innovator model 304 as additional nodes within the schema 412.

In addition to defining the hierarchical structure of the plant ecosystem as represented by schema 412, the model definition input 302 can also define users associated with the various entities defined by the model 304 (technology owner 202 and manufacturing entities 214) and their respective roles. This user and role information is stored in association with the model 304 as user definition data 414. The role of each user will determine the degree of visibility and access the user has to the information contained in the model 304.

FIGS. 5-10 illustrate various example interface displays that can be rendered by the user interface component 104 and used to submit model definition input 302. FIG. 5 is an example company definition display 502 that can be used to submit information about the technology owner 202 for which the innovator model 304 is being built. Display 502 can include data entry fields for submitting information about the technology owner 202 (or company), including the owner's name, status, location (country, state, city, zip code, etc.) web address, and phone number. Once this company information is entered, selecting the submit button 504 on the display 502 registers the technology owner 202 and allows the owner's innovator model 304 to be built.

FIG. 6 is an example manufacturer definition display 602 that can be used to submit information about a manufacturing entity 214 to be associated with a technology owner 202. Display 602 includes a drop-down selection field 606 for selecting the technology owner 202 for which a manufacturer is being defined. The selection field 606 is populated with the names of any registered technology owners 202 that were registered using display 502 illustrated in FIG. 5. Interface display 602 also include data entry fields for entering information about the manufacturing entity to be defined for the selected technology owner 202, including the manufacturer's name, type, status, location (country, city, state, zip code, etc.), web address, and phone number. Once values of these fields have been entered, selecting a Submit button 604 causes the submitted manufacturer information to be added to the technology owner's innovator model 304.

Figure 7:
FIG. 7 is an example manufacturer summary display that lists defined manufacturing entities that have been registered with the technology transfer system.

FIG. 7 is an example manufacturer summary display 702 that lists all defined manufacturing entities 214 that have been registered with the system 102 using interface display 602. This summary display 702 lists the registered manufacturing entities in tabular form, including columns that indicate each manufacturer's type and location, as well as the technology owner 202 (company) with which the manufacturer is associated. Display 702 also indicates, for each registered manufacturer, a date on which the manufacturer was registered with the system 102 and an identity of the authorized user who registered the manufacturer. From this display 702, a user can invoke display 602 to register another manufacturing entity 214 by selecting the Add New Manufacturer button 704.

Figure 8A:
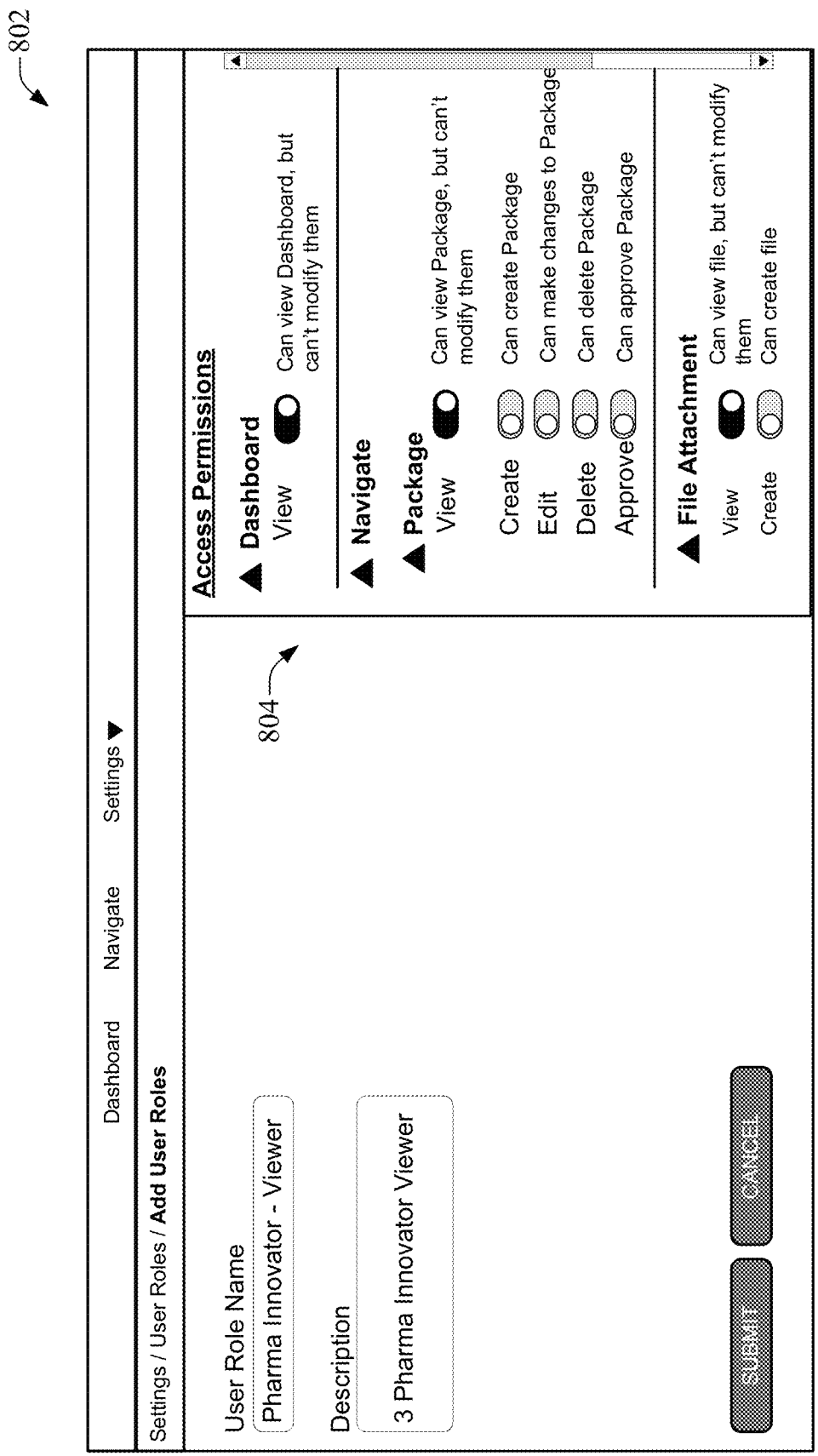
FIG. 8a is a first view of an example user role definition interface that can be used to define user roles and their associated permissions.

FIGS. 8a and 8b are views of an example user role definition interface 802 that can be used to define user roles and their associated permissions. Interface 802 includes data entry fields for entering a name and description of the user role, as well as an Access Permissions switchboard panel 804 that lists configurable permission categories that can be set for the user role. The access permissions configured using switchboard panel 804 determine the degree to which users assigned to the role are permitted to view and engage with information in the model 304. Permissions that can be set using control panel 804 can include, but are not limited to, the user's ability to invoke dashboards that provide a view into the data contained in the model 304; the user's ability to view, create, edit, delete, or approve a product package (that is, package represented by technology transfer document 204); the user's ability to view or create a file attachment; the user's ability to view, create, edit, or delete manufacturer information registered with the system 102; the user's ability to view, create, edit, or delete plant information registered with the system 102; the user's ability to view, create, edit, or delete user information; the user's ability to submit package approvals; or other such permissions.

The panel 804 allow access permissions for various access categories to be set at substantially any degree of granularity in various embodiments. In the illustrated example, the panel 804 segregates the access permissions according to category (e.g., package permissions, file attachment permissions, manufacturer permissions, plant permissions, user permissions, etc.), and specific permissions under each category can be set via interaction with binary switches next to each permission, such that the switch setting indicates whether the user role is to be permitted or denied the corresponding permission.

FIG. 9 is an example user role summary display 902 that lists the user roles currently registered with the system 102. The user roles are listed in a tabular format, with columns indicating, for each defined user role, a description of the role, a date on which the role was registered, and an identity of a user who registered the user role. Example user roles can include, but are not limited to, a viewer associated with the technology owner 202, a viewer associated with a manufacturing entity 214 (which may be afforded more limited access to the model 304 whereby the viewer can only view information associated with his or her affiliated manufacturing entity), an administrator, a reviewer, an operator, an engineer, a maintenance person, or other such roles. A user with suitable editing privileges can edit any of the user roles listed on display 902 by selecting an editing control 904 next to the role, which invokes the user role configuration interface 802 for a selected user role.

FIG. 10 is an example user definition display 1002 that can be used to register new users with the system 102. Display 1002 comprises data entry fields for entering a user's name, contact information (email address, phone number, etc.), and location (country, state, city, zip code, etc.). Display 1002 also includes a drop-down selection field 1004 for selecting a user role to which the user is to be assigned. Selection field 1004 is populated with the user roles that were defined using interface 802 illustrated in FIGS. 8a and 8b. Designating a pre-defined user role to the user in this way assigns the user the same access permissions that were defined for the role.

Based on information provided by a user using the model configuration displays described above in connection with FIGS. 5-10, or other model configuration displays having similar functionalities, the model builder component 106 creates a hierarchical innovator model 304 that is specific to a given technology owner 202 and which represents manufacturing entities 214 having a business relationship with the technology owner 202. Plant facilities owned by the respective manufacturing entities 214, as well as their respective capabilities and lines, are also represented in the model 304. Since a given technology owner 202 may have contracts with multiple manufacturing entities 214, the model 302 represents a one-to-many relationship between the technology owner 202 and its associated manufacturing entities 214.

Figure 11:
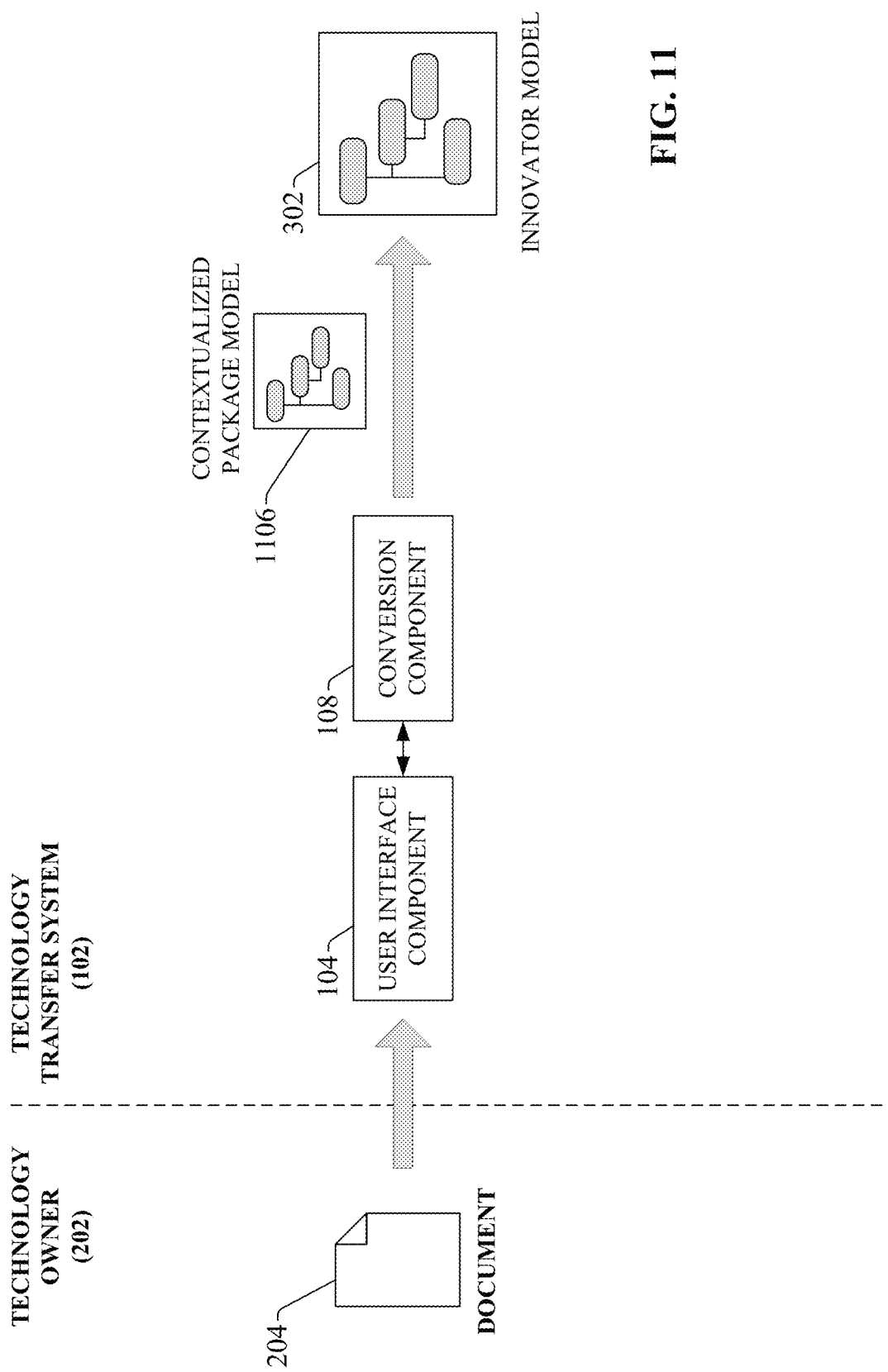
FIG. 11 is a diagram illustrating submission of a technology transfer document to the technology transfer system by a technology owner.

Once the innovator model 304 established, the technology owner 202 can begin submitting technology transfer documents 204 to the system 102 for translation and deployment to selected manufacturing entities 214 via interaction with the model 302. FIG. 11 is a diagram illustrating submission of a technology transfer document 204 to the technology transfer system 102 by a technology owner 202. User interface component 104 can render, on a client device associated with an authorized representative of the technology owner 202, a document submission interface that allows the authorized representative to upload a technology transfer document 204 to the system 102. Technology transfer document 204 can be submitted to the system 102 in substantially any digital format, including but not limited to a PDF file, a word processing file, an image file such as a joint photographic exports group (JPEG) file, or another format containing natural language content. In general, technology transfer documents 204 are written to convey information about a manufacturing process for a given product (e.g., a pharmaceutical product) from a technology owner 202 to a manufacturing entity 214. These documents 204 can describe the manufacturing operations, process stages, process steps, and process parameters to be followed as part of the process of producing the product. An example technology transfer document 204 can be written as a structured natural language document comprising various sections and sub-sections that convey different aspects of the manufacturing process.

Figure 12A:
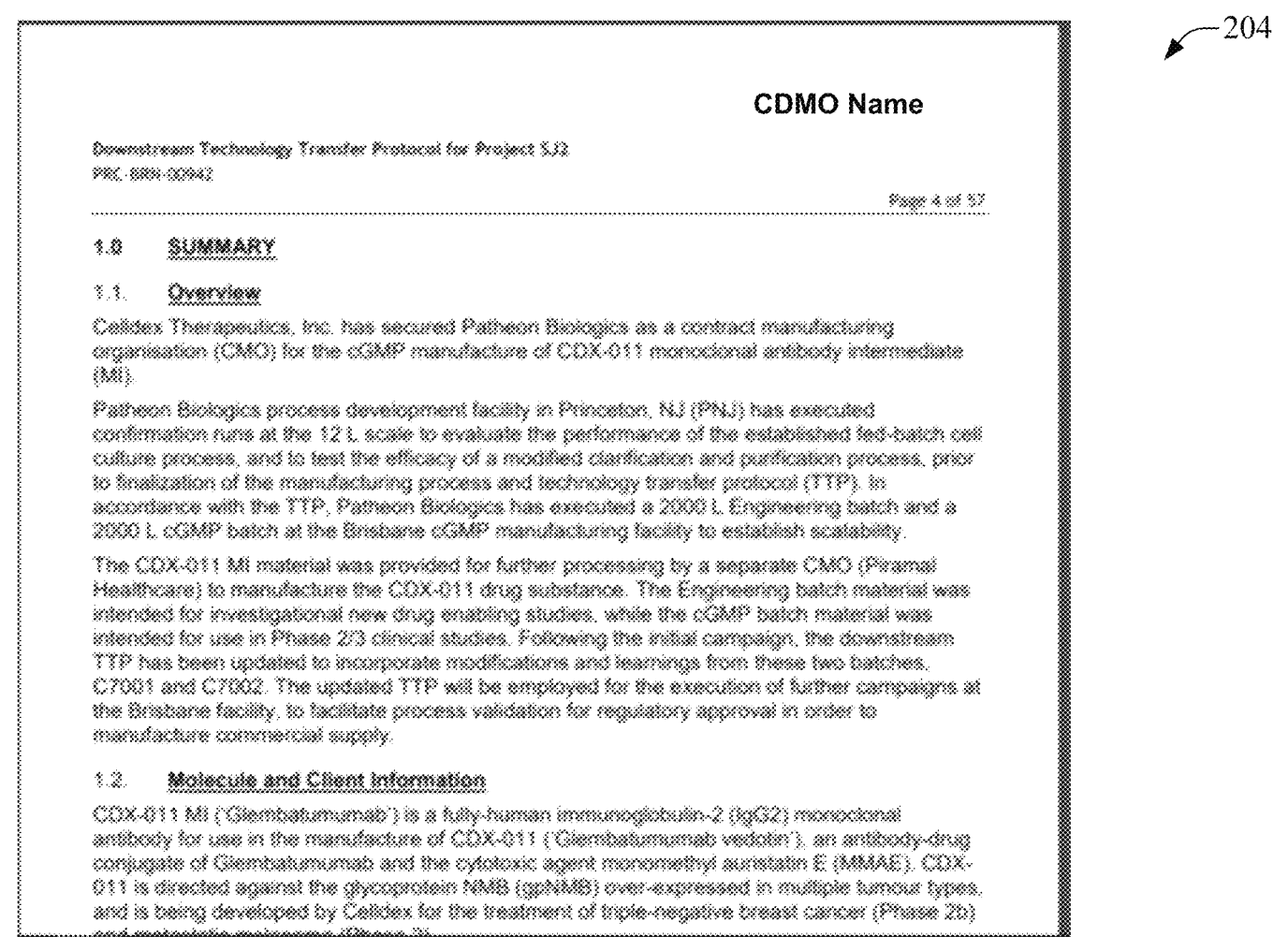
Figure 12B:
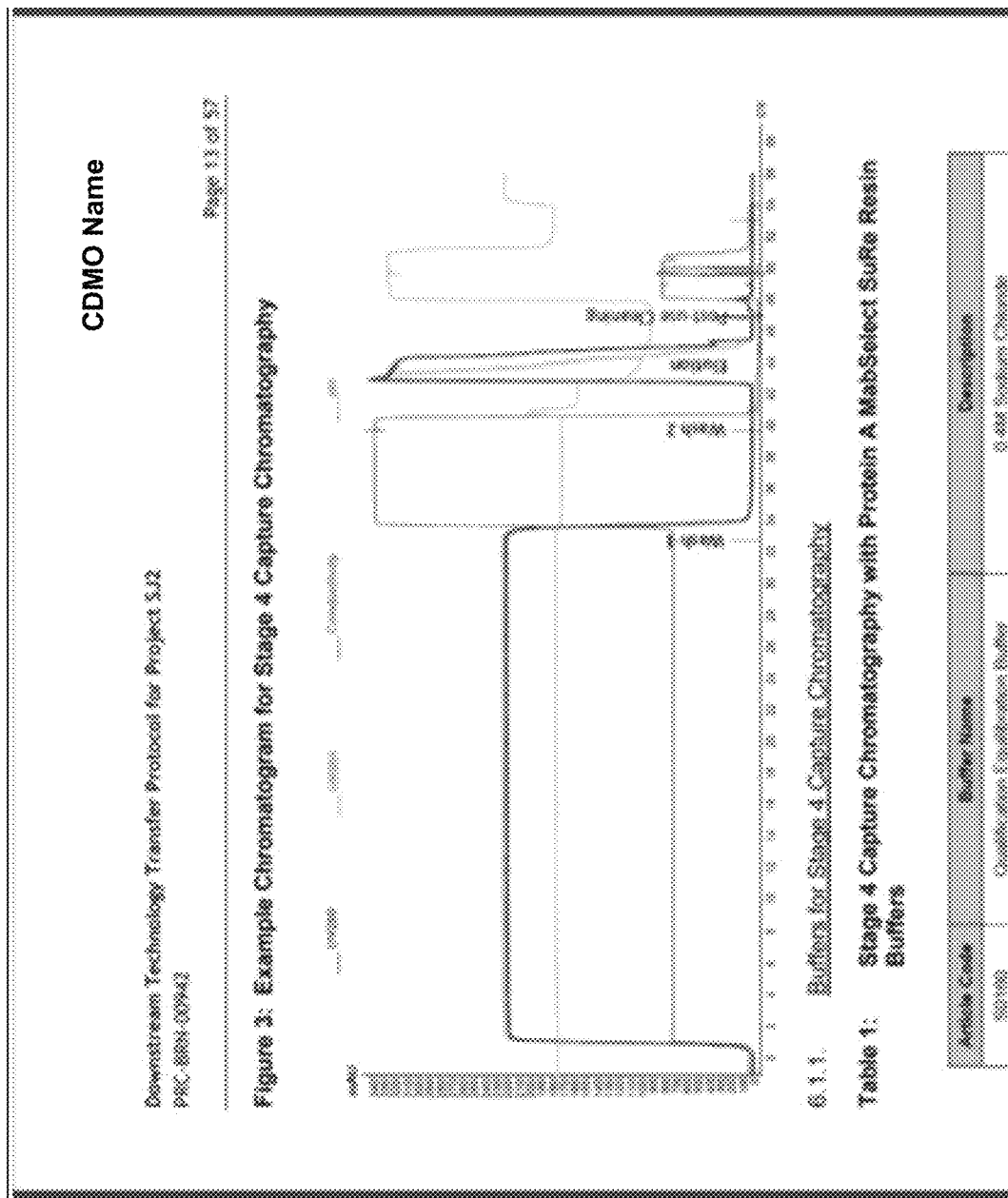
FIG. 12b is a second segment of the example technology transfer document.

FIGS. 12a and 12b are two segments of an example technology transfer document 204. As shown in FIG. 12a, document 204 can include a summary section (Section 1.0) under which are various summary sub-sections, including an overview sub-section (Section 1.1) that describes the product to be manufactured and background information regarding the development of the product. Other sub-sections can provide further background information for the product. Other sections of the document 204 can describe the process stages and associated process steps for manufacturing the product in more detail. This process information can include natural language descriptions of the process as well as any figures, charts, tables, or process parameters necessary to describe the process to the manufacturing entity 214 at a level of detail sufficient to carry out the manufacturing process.

Returning to FIG. 11, once the technology owner 202 has submitted or uploaded the technology transfer document 204 to the system 102, the conversion component 108 processes and translates the document 204 to a contextualized package model 1106 that digitally represents the document 204 in a hierarchical object notation. The package model 1106 can comprise a hierarchical structure having nodes representing respective aspects of the document 204, including the manufacturing processes, stages, steps, and control parameters described in the document 204.

Figure 13:
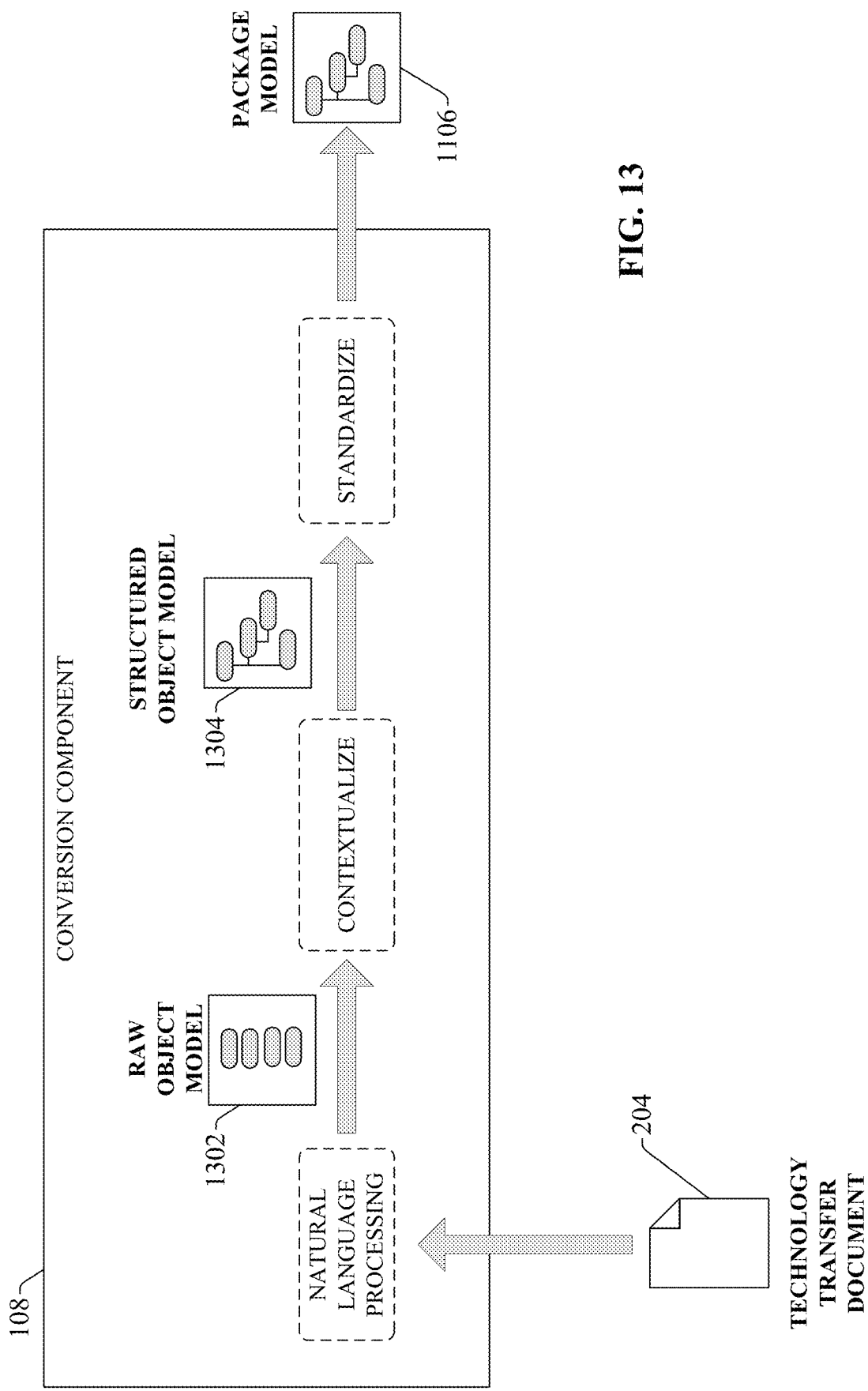
FIG. 13 is a diagram illustrating an example translation process that can be carried out by the conversion component of the technology transfer system.

FIG. 13 is a diagram illustrating an example translation process that can be carried out by the conversion component 108 in one or more embodiments. According to an example translation process, the conversion component 108 can initially apply natural language processing to the document 204 as part of a cognitive service and generate a raw object model 1302 representing the document 204 based on results of this processing. The raw object model 1302 is an intermediate, uncontextualized representation formatted according to any suitable object notation, such as JavaScript Object Notation (JSON). The raw object model 1302 comprises objects or nodes representing the various sections and sub-sections discovered in the document 204 based on the natural language processing. The conversion component 108 can be trained to identify characteristics of the document 204 indicative of a section or sub-section, including but not limited to alphanumeric headers within the document, recognizable content formatting or properties from which the types of content within the document 204 can be inferred, or other such characteristics.

Also, in some embodiments, the conversion component 108 can be configured to recognize sections or content types contained in the document 204 based on tags embedded in the document 204. These tags may be included in the document 204 if the document 204 was created using a pre-defined template that allows a user to generate the document 204 by entering document content—e.g., process stage or step descriptions, graphs, charts, process parameters, etc.—in designated data entry fields corresponding to the different types of content. This approach to creating the technology transfer document 204 can yield a document 204 having embedded tags that identify the different types of content, and these tags can be leveraged by the conversion component 108 to identify the various document sections and translate those sections into corresponding nodes of the raw object model 1302.

One the raw model 1302 has been generated, the conversion component 108 can apply contextualization processing to the raw model 1302 to organize the objects of the raw model 1302 into a meaningful hierarchical structure, yielding a structured object model 1304. The structured object model 1304 (which can also be formatted in JSON in some embodiments) comprises a hierarchical organization of nodes representing the various content items contained in the document 204, where the hierarchical structure reflects the relationships between the different items of content. For example, a node representing a section of the document may be defined in the structured model 1304 as a parent node of multiple child nodes representing the sub-sections within that section. In another example, a parent node representing a process stage may have a number of associated child nodes representing process steps that make up the stage. These process step nodes may have associated child nodes representing control parameters (e.g., temperatures, fill levels, etc.), graphs, or tables associated with that step of the process.

In some embodiments, the conversion component 108 can create the structured object model 1304 by identifying labels, tokens, or keys contained in the raw object model 1302 and organizing the nodes of the structured object model 1304 based on these labels. This conversion can be carried out based on defined rules for converting the labels to contextual information that can be used to determine an appropriate structure for the model 1304.

As a final conversion step, the conversion component 108 can translate the structured object model 1304 to an industrial standard that is specific to the industrial vertical of the product described by the document 204. For example, in some embodiments the conversion component 108 can organize the object model 1304 to conform to an ISA-88 standard for modeling or describing industrial processes in terms of plant facilities, plant areas, lines, equipment, devices, stages, steps, and other units of an industrial process. Applying this standardization to the structured object model 1304 yields the finalized package model 1106, which digitally represents the contents of the technology transfer document 204 as a contextualized hierarchical structure of nodes or objects. The resulting package model 1106 represents a digital technology transfer package for a given product to be produced by one or more of the manufacturing facilities defined in the innovator model 304.

Returning to FIG. 11, the resulting contextualized package model 1106 is then partitioned and integrated into the innovator model 304 in accordance with distribution information 1102 submitted by the technology owner 202. Once the package model 1106 has been generated, the technology transfer system 102 allows the technology owner 202 to identify which of the available manufacturing facilities defined in the innovator model 304 are to be assigned to carry out the respective process stages or steps represented in the package model 1106. Integration of one or more package models 1106 into the innovator model 304 yields the aggregate hierarchical model 208 (see FIG. 2)

Figure 14:
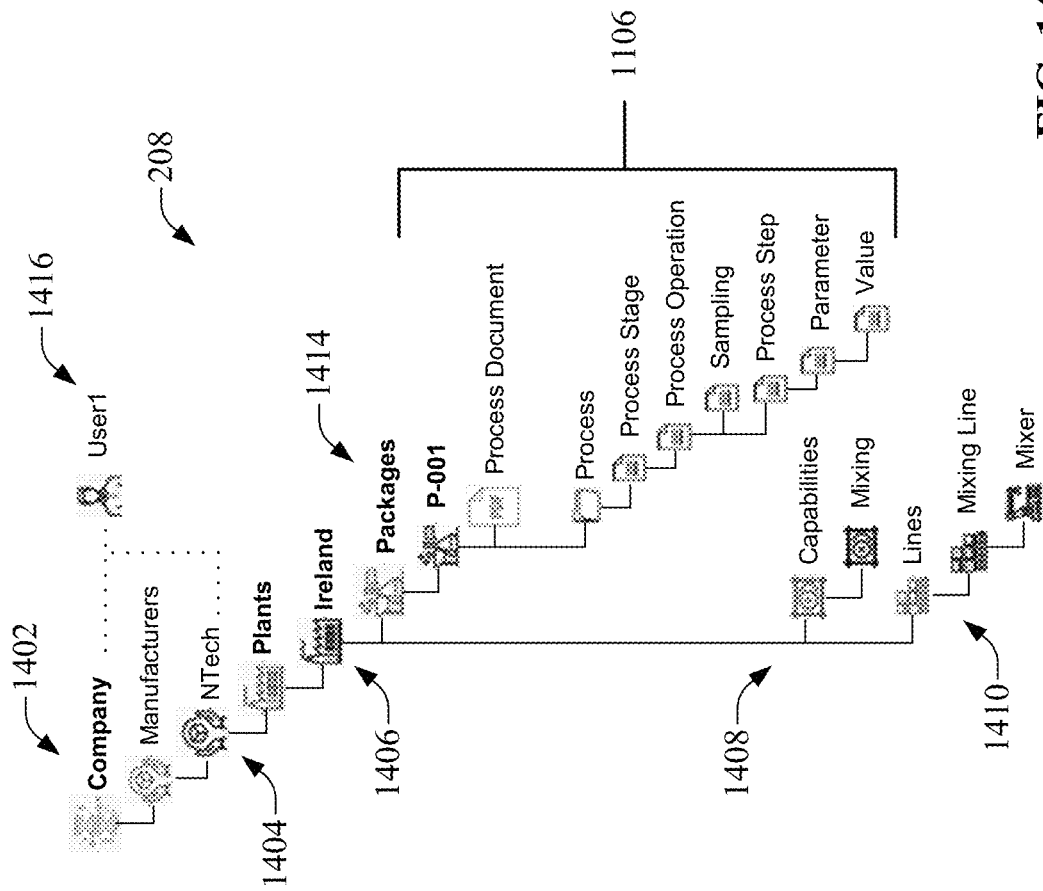
FIG. 14 is a hierarchical representation of an example aggregate model comprising an innovator model into which a package model representing a technology transfer document has been integrated.

FIG. 14 is a hierarchical representation of an example aggregate model 208 comprising an innovator model 304 into which a package model 1106 has been integrated. As described above, the innovator model 304, which serves as the basis for the aggregate model 208, comprises a parent node 1402 representing the technology owner 202 (Company), below which are a number of manufacturer nodes 1404 representing manufacturing entities 214 that were defined as having a business relationship with the technology owner 202 using configuration displays 602 and 702.

Although only a single manufacturing node 1404 is depicted in FIG. 14 for clarity, the model 208 may comprise multiple manufacturers nodes 1404 defined in the Manufacturers layer. Below each manufacturer node 1404 are one or more plant nodes 1406 representing plant facilities that are owned and managed by the corresponding manufacturer. In some scenarios, the plant node 1406 may be named after the country, state, or city in which the plant facility is located.

Each plant node 1406 has an associated Capabilities layer 1408 that defies, as child nodes, in-plant capabilities supported by the corresponding plant (e.g., mixing, machining, packaging, etc.). A Line layer 1410 under each plant node 1406 comprises child nodes representing the production lines in operation within the plant facility, and which support the capabilities defined under the Capabilities layer 1408. The production line nodes under the Lines layer 1410 can comprise child nodes representing items of equipment (e.g., mixers) that make up each production line. In some embodiments, the system 102 can set information about a given plant's manufacturing capabilities or production lines based on analysis of plant documentation uploaded to the system 102, such as plant capability documents or line layout drawings.

Technology transfer system 102 allows a technology owner 202 to assign technology package information, as represented by the contextualized package model 1106, to selected plants defined in the model 208. To this end, each plant node 1406 defined in the model 208 can have an associated Packages layer 1414, below which one or more technology transfer packages—represented by package model 1106— can be created. Within the context of the model 208, a technology transfer package comprises the hierarchical structure of nodes defined by the contextualized package model 1106, which itself represents a technology transfer document 204. Once the conversion component 108 has translated a technology transfer document 204 to a hierarchical package model 1106 as described above, the technology owner 202 can selectively assign the resulting package model 1106 to one or more plants defined in the larger hierarchical model 208. Typically, the selected plants will belong to manufacturing entities 214 who will be contracted to execute one or more of the manufacturing process stages or steps described in the document 204.

In an example workflow, the user interface component 104 can render, on a client device associated with an authorized representative of the technology owner 202, a browsable representation of the innovator model 304 that allows the representative to browse the available manufacturers, their plant facilities, and the lines and capabilities of those facilities. The representative can then selectively assign a package—represented by package model 1106— to a selected one or more of the plant facilities. Based on this selective association, the system 102 integrates the package model 1106 into the larger innovator model 304 by adding the hierarchical structure of the package model 1106 to the Packages layer 1414 of the selected plant, yielding the aggregate model 208. As shown in FIG. 14, the package is represented by a parent node identifying the package (e.g., "P-001") below which are nodes representing the process document for the product represented by the package as well as the process for manufacturing the process. The Process Document node represents documentation describing the product, as obtained from the original technology transfer document 204, and may comprise child nodes (not shown in FIG. 14) representing various sections and subsections of the descriptive portions of the document 204. Below the Process node are child nodes representing one or more stages of the manufacturing process for producing the products. A given stage may comprise one or more operations, which are also represented as child nodes below the Process Stage node. Process steps that make up a given operation of the process stage are also represented as child nodes below the Process Operation node. Any control parameters (e.g., temperatures, pressures, etc.) associated with a given process step are represented as child nodes below the Process Step node. Other informational entities contained in the original document 204, such as flow diagrams or charts, can also be represented as nodes of the package. The package has been assigned to a plant facility located in Ireland, and consequently the package model 1106 has been added below the plant node 1406 corresponding to that plant.

In general, each package encapsulates the contents of a given technology transfer document 204 as a digital structure formatted in accordance with an industrial standard, such as ISA-88. The nodes of the package model 1106 can be expanded to view the processes steps, stages, and parameters that make up the package, and which convey to the manufacturing entities 214 the recipes and processes for manufacturing the product represented by the document 204.

Although FIG. 14 depicts a single package that has been assigned in its entirety to a single plant (Ireland), any number of packages representing translated documents 204 can be submitted to the system 102 and assigned to one or more plants. Moreover, a given package may be partitioned among multiple different plants if different stages of the package's manufacturing process are to be carried out at different plant facilities. In such scenarios, the user can reference information in the Capabilities layer 1408 for each plant to determine whether a given plant has the necessary capabilities for carrying out a particular operation or stage of the manufacturing process. In some embodiments, the system 102 can verify that each operation of the package has been assigned to a plant whose capabilities satisfy the requirements of the operation. In response to determining that the technology owner 202 has attempted to assign a process operation or stage requiring a capability (e.g., mixing) to a plant that does not support that capability, the user interface component 104 can render a warning or notification that the selected plant may not be capable of carrying out the operation.

Figure 15:
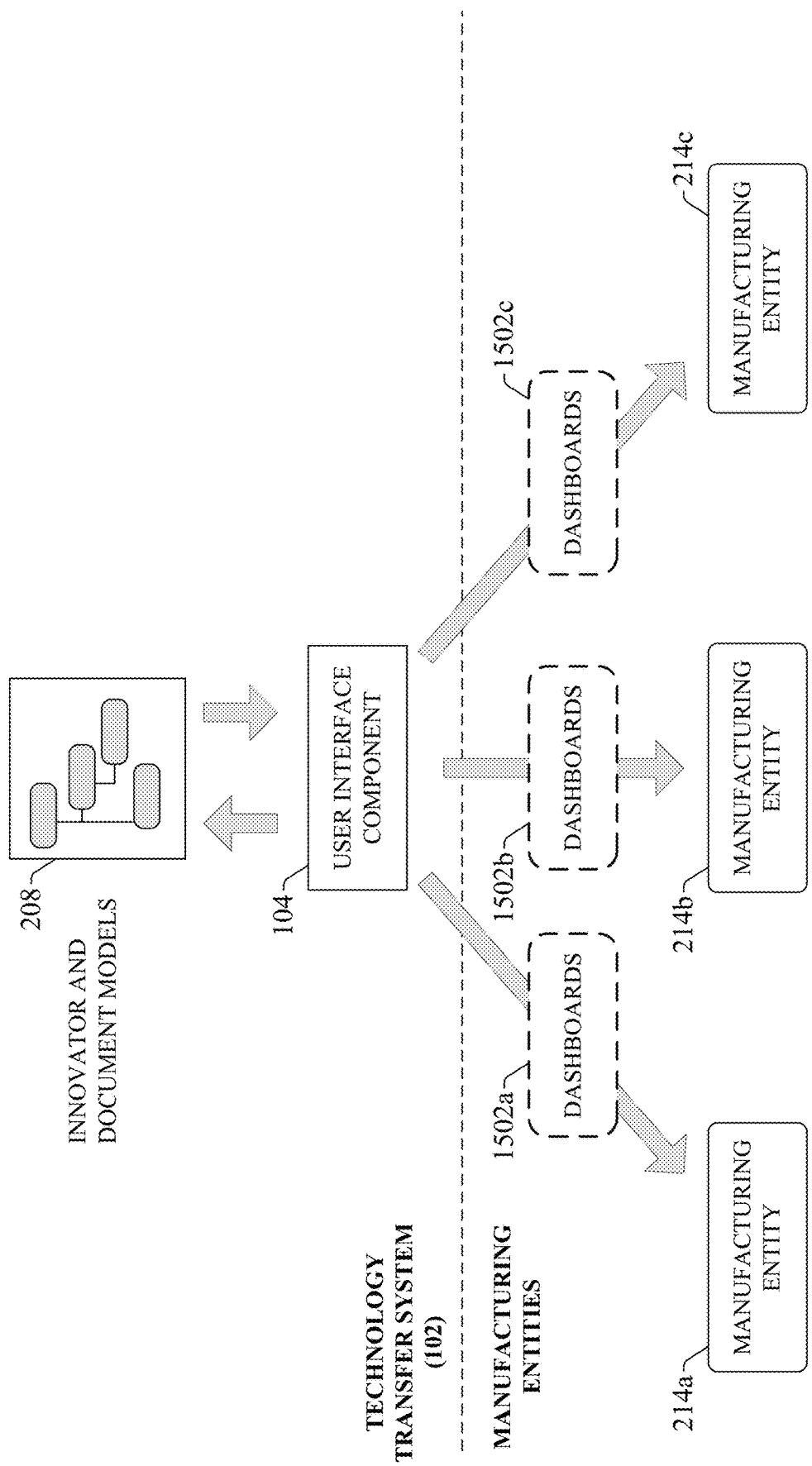
FIG. 15 is a diagram illustrating the multi-tenant architecture of the technology transfer system whereby users associated with different manufacturing entities are permitted their own role-specific views of the data contained in an aggregated innovator and document model.

The system 102 permits various types of users to view and interact with the model 208 in different ways based on the role-specific access permissions defined using interface 802 as described above, and further based on their entity affiliations. For example, users 1416 that are affiliated with the technology owner 202 (represented by company node 1402) can access all data below the company node 1402, including data associated with multiple different manufacturing entities that have a business relationship with the technology owner 202. By contrast, users affiliated with a given manufacturing entity 214 can only access data under their own manufacturer node 1404, while being prevented from accessing data associated with other manufacturers. FIG. 15 is a diagram illustrating the multi-tenant architecture of the technology transfer system 102, whereby users associated with different manufacturing entities 214 are permitted their own role-specific views of the data contained in the model 208, which are presented via dashboards 1502 generated by the user interface component 104. Since there may be a one-to-many relationship between a technology owner 202 and the manufacturing entities 214 contracted to manufacture product for the technology owner 202, users associated with each manufacturing entity 214 defined in the model 208 are permitted to view and interact with limited sections of the model 208.

Figure 16:
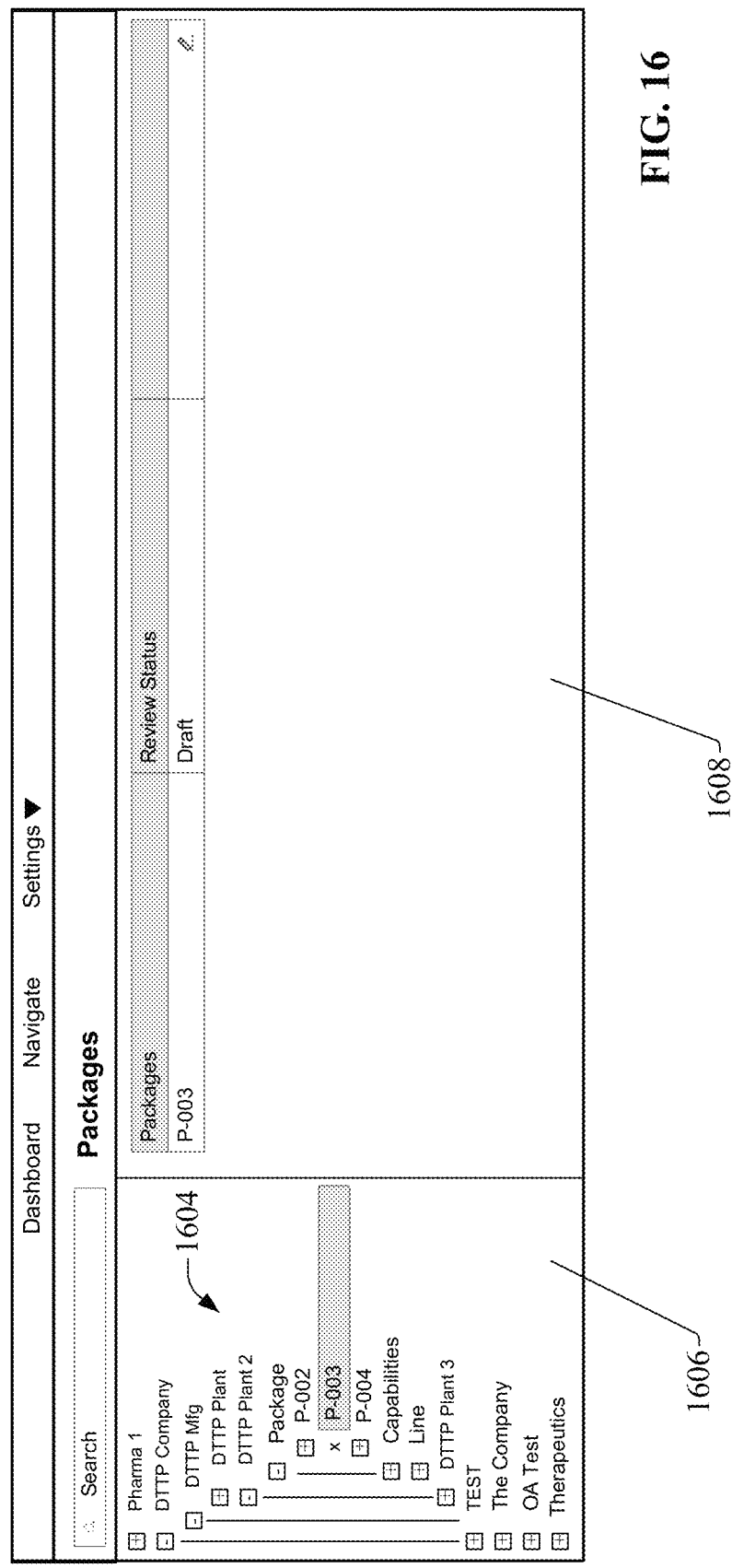
FIG. 16 is an example dashboard interface that can be generated by the technology transfer system for browsing package data and other elements of the model.

The user interface component 104 can render entity- and role-specific dashboards 1502 or other types of user interfaces to client devices associated with users affiliated with respective manufacturing entities 214, or with the technology owner 202. These dashboards allow a user to browse portions of the model 208, including components of the package model 1106, that are within the scope of the user's defined access permissions. The dashboards 1502 also allow the user to interact with or edit portions of the model 208 to a degree permitted by the user's role and entity affiliation. FIG. 16 is an example dashboard interface 1602 that can be generated by user interface component 104 for browsing package data and other elements of the model 208. This example interface 1602 comprises a navigation window 1606 that renders a navigation tree 1604 comprising the hierarchical structure of elements (manufacturers, plants, packages, etc.) defined by the model 208. Navigation tree 1604 serves as a visualization of the model 208 that has been filtered or customized based on the user's access permissions. For example, if the user is affiliated with the technology owner 202, all nodes and data of the model 208 are visible and accessible via navigation tree 1604. Alternatively, if the user is affiliated with a manufacturing entity 214, the navigation tree 1604 may only reflect the portion of the model 208 relating to the user's affiliated manufacturing entity 214.

Selecting a node of the navigation tree 1604 causes summary information for packages associated with the selected node to be displayed in a results window 1608. In the illustrated example, the user has selected package P-003, which has been assigned to a plant DTTP Plant 2 owned by manufacturing entity DTTP Mfg. This causes information about the selected package P-003 to be displayed in the results window 1608. The results rendered in window 1608 can depend on the level of the tree 1604 that is selected. For example, selection of a node representing a manufacturing entity or plant facility causes all packages assigned to that manufacturer or plant to be displayed in window 1608.

As will be described in more detail below, once a technology transfer document 204 for a new package has been translated to a contextualized package model 1106 and integrated into the aggregate model 208, the technology transfer system 102 can manage editing, version control, approval, and sign-off for the package. Accordingly, the summary information for the selected package displayed in the results window 1608 includes the current review status of the selected package. At various stages of the package's lifecycle, the package may transition through such statuses as "Draft," "In Review," "Rejected," "Accepted," or "In Production." System 102 provides tools for package reviewers to view packages that are currently in review, to submit their approval or rejection of the package, and to share comments or proposed edits with other reviewers. The status of the package is updated in accordance with these interactions.

Figure 17:
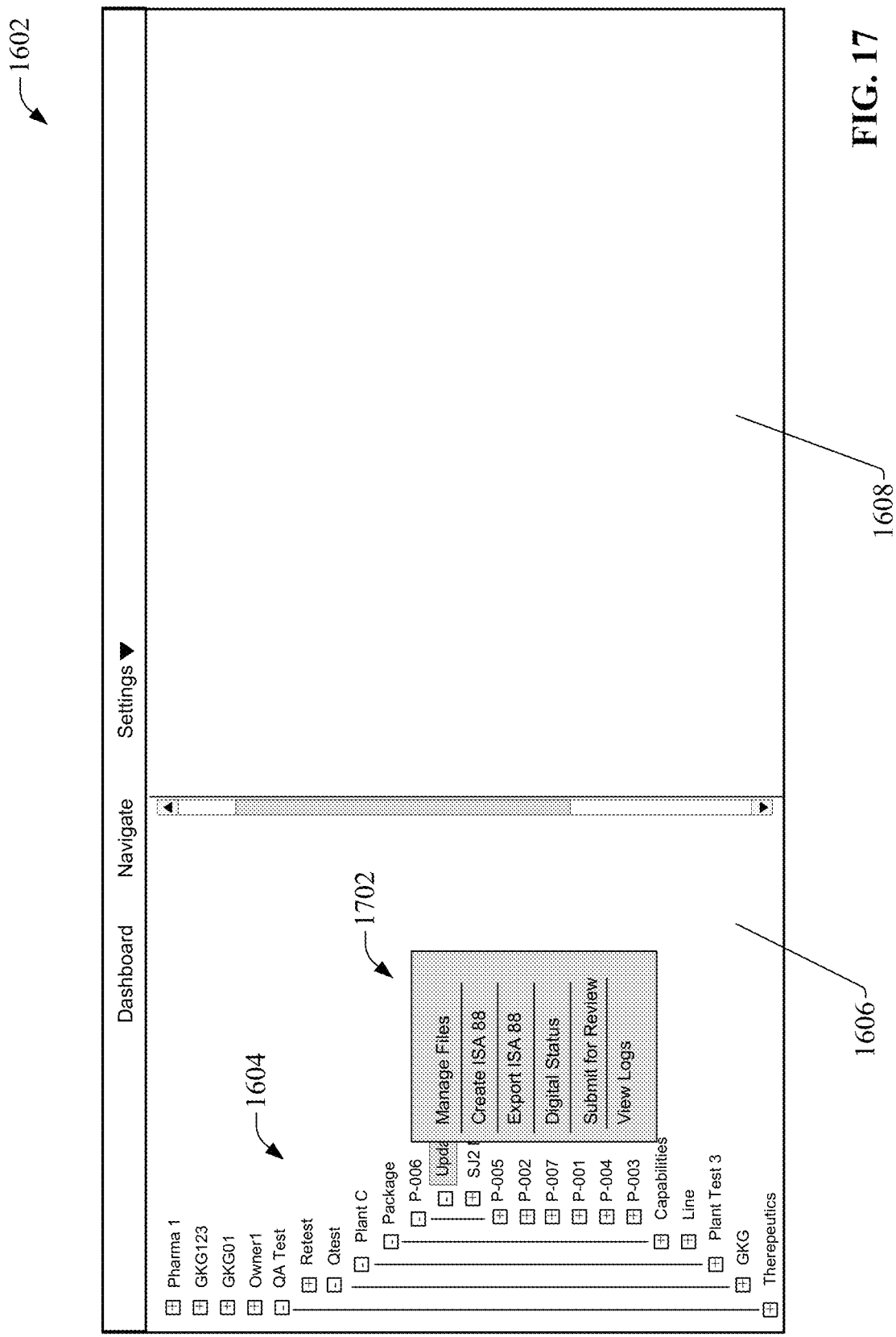
FIG. 17 is another view of the dashboard interface illustrating submission of a package for review.

FIG. 17 is another view of interface 1602 illustrating submission of a package for review. A package that has been submitted to the system 102 and integrated into model 208 can be assigned to a designated set of reviewers, and the package is only permitted to be put into production after all reviewers have approved a finalized version of the package. To initiate the review process, an administrator can invoke a menu window 1702 via interaction with the node representing the package (e.g., P-006). Menu window 1702 lists various selectable actions relating to the package, including file management, exporting the package's hierarchical model, invoking the digital status of the package, or invoking a log of interactions with the package. The menu window 1702 also includes a selection for submitting the package for review, selection of which places the package in "Review" status. When the package is submitted for review, the system 102 (e.g., the package management component 116) can send notifications directed to users who have been designated to review the package. Package reviewers can be identified as users whose user role affords permission to approve a package, as defined using the Access Permissions configuration control panel 804 (see the Package section of the control panel 804 illustrated in FIG. 8*a*). The reviewers may also have been expressly assigned to review the package in some scenarios. The notification informs the reviewers that the new package is available for review.

Figure 18:
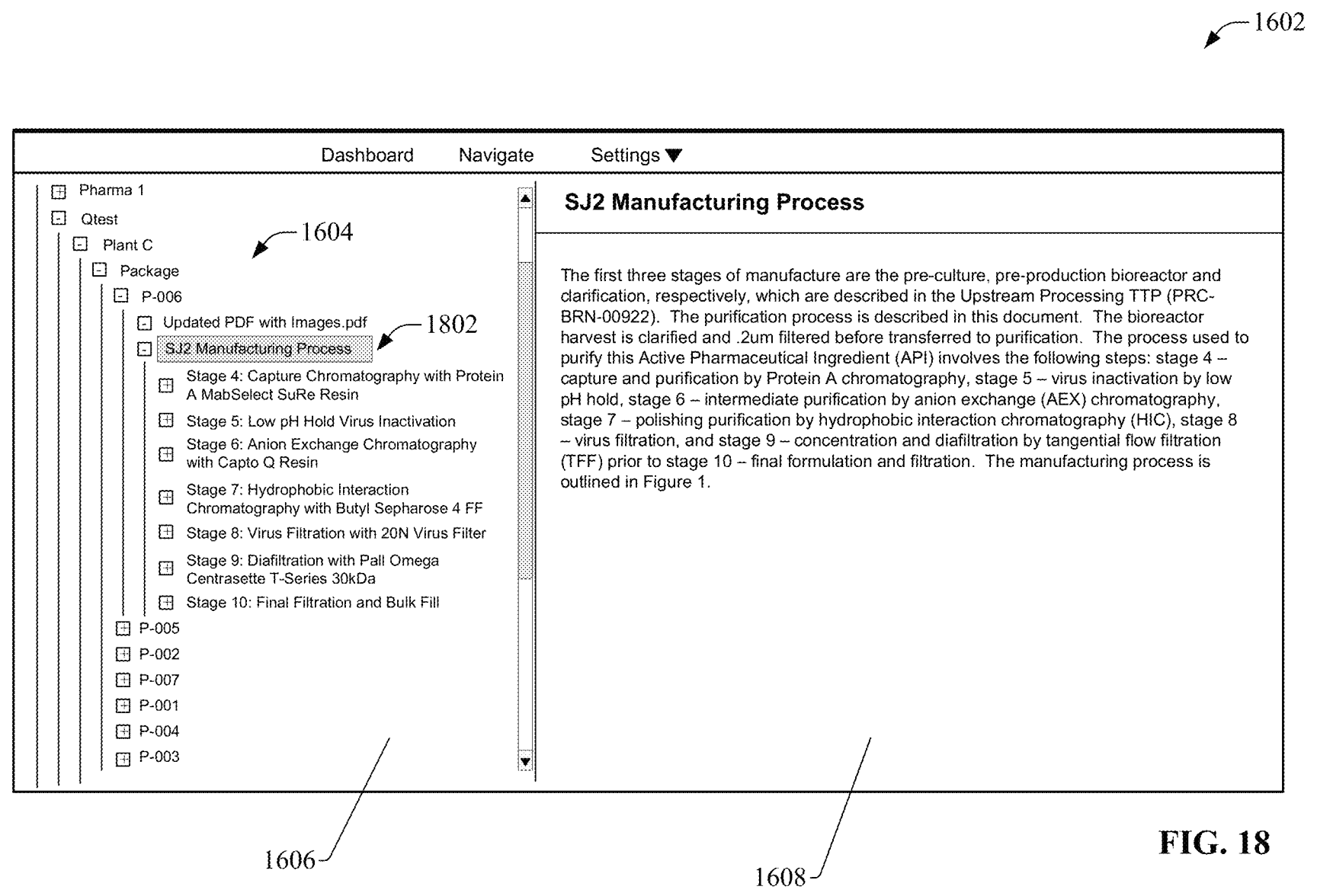

Designated users can review content of the package by browsing the navigation tree 1604 and selecting nodes representing sections of the package. FIG. 18 is a view of interface 1602 in which a section of a package has been selected for review. As shown in this view, a selected package (e.g., P-006) can be expanded in the navigation tree 1604 to reveal a hierarchical organization of nodes representing the package's content, including the stages and steps that make up the manufacturing process for the package. The package nodes correspond to sections of the original technology transfer document 204, and the arrangement of these nodes reflects the hierarchical model 1106 of the package (see FIG. 14) generated from the original document 204. In the example depicted in FIG. 18, selection of the P-006 package node has expanded the package model to review a manufacturing process node 1802 (SJ2 Manufacturing Process), below which are nodes representing the various stages that make up this process. Selection of the manufacturing process node 1802 causes a description of the process to be displayed in the results window 1608. This description is drawn from the original technology transfer document 204 and was extracted from document by the conversion component 108 during the document translation process described above.

Figure 19:
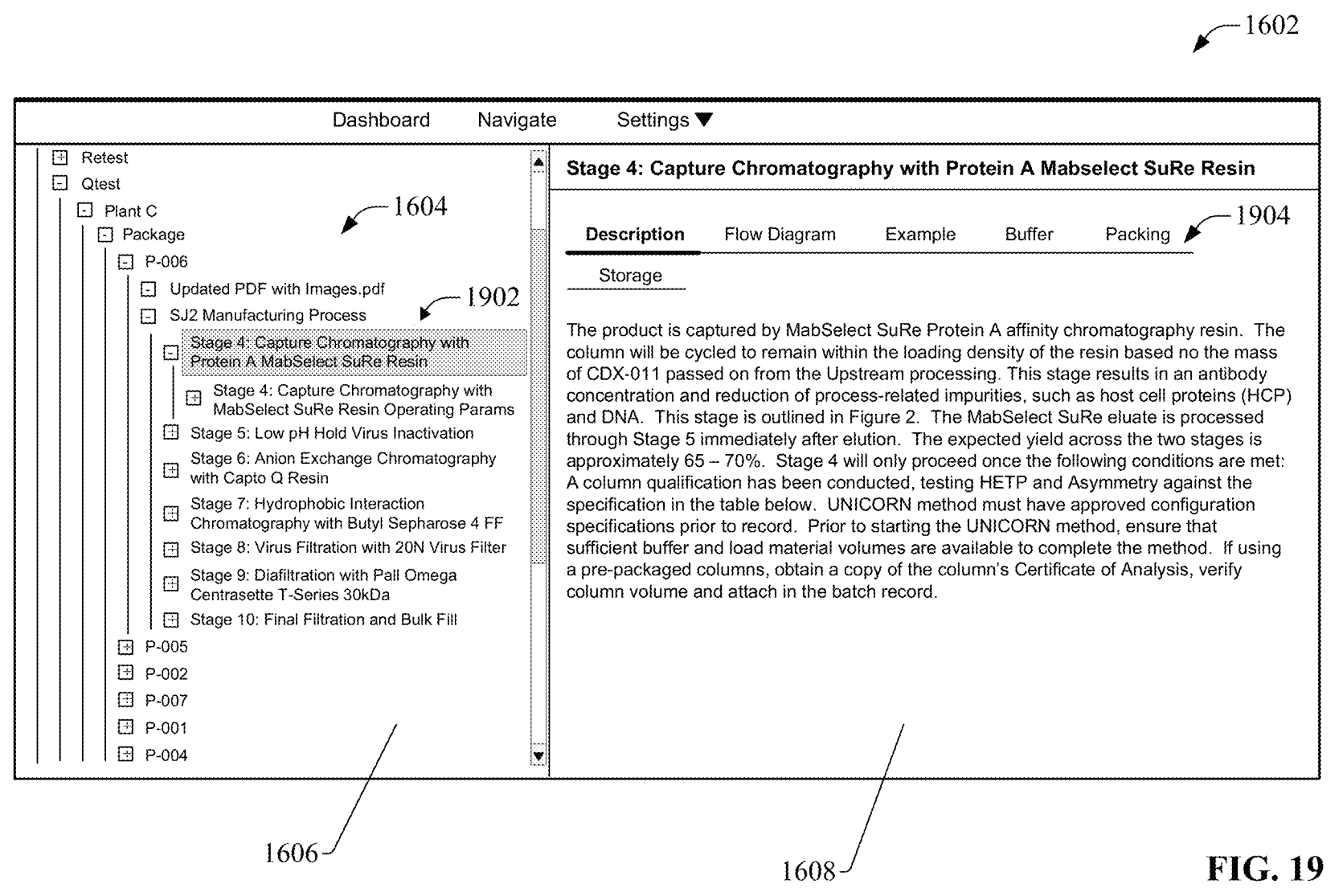

FIG. 19 is a view of interface 1602 when one of the stage nodes is selected. In this example, the user has selected the node 1902 corresponding to Stage 4 of the manufacturing process. Selection of this Stage node 1902 causes detailed information about the corresponding stage to be displayed in the results window 1608. If more than one type of information is associated with the selected stage, the results window 1608 displays a set of category tabs 1904 representing the different types of information available. Example types of information that can be associated with a selected stage of a manufacturing process can include, but are not limited to, a description of the stage; flow diagrams, charts, or tables associated with the stage; illustrative examples; control parameters for the stage; or other such information. Selection of one of the category tabs 1904 causes the information associated with the selected category to be displayed in the results window 1608.

Figure 20:
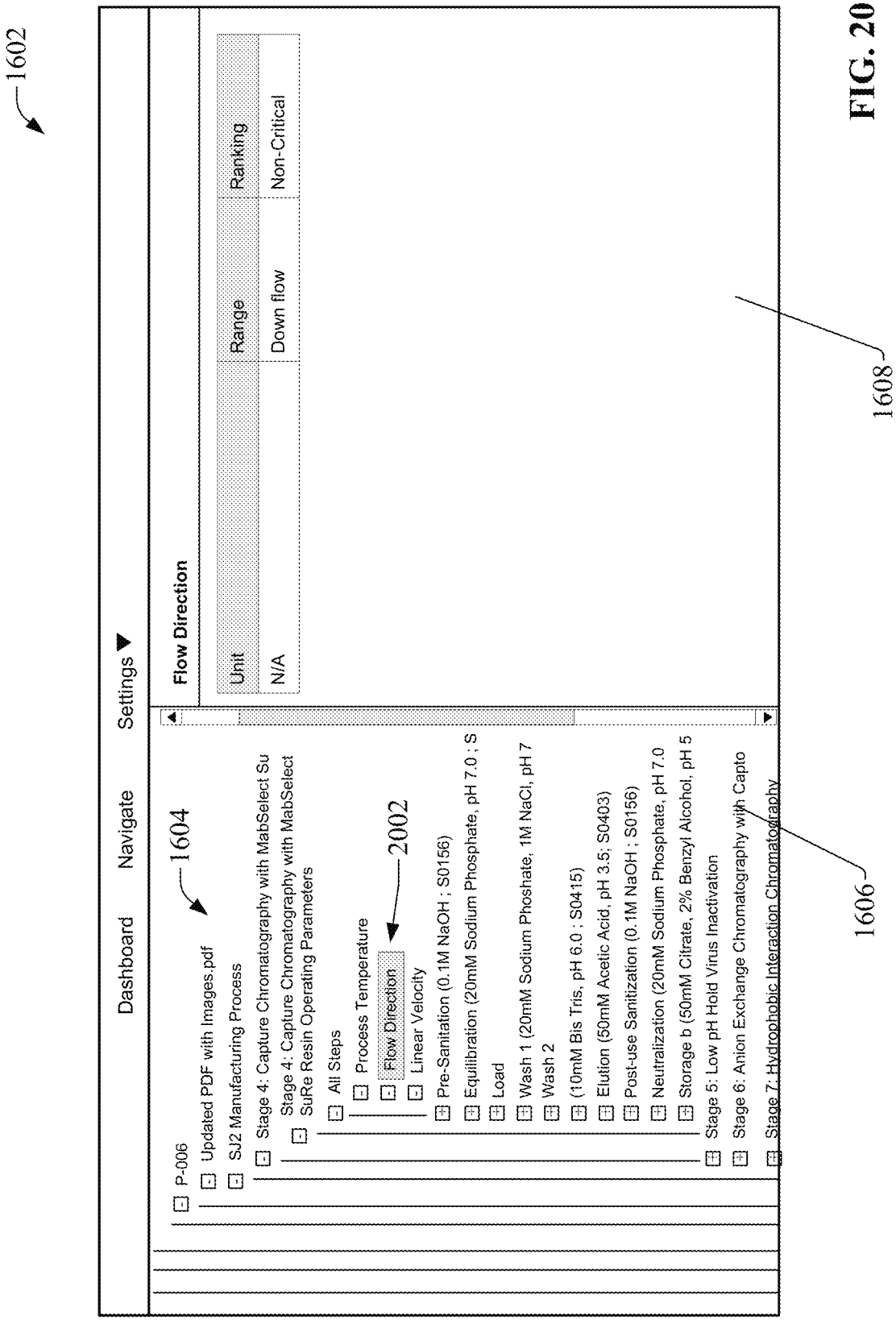
FIG. 20 is another view of the dashboard interface in which the user has navigated further down into the selected stage of the manufacturing process.

FIG. 20 is another view of interface 1602 in which the user has navigated further down into the selected stage of the manufacturing process. Selecting a Stage node 1902 in the navigation tree 1604 can expand the node to reveal one or more Step nodes 2002 representing the steps that make up the stage. Selection of one of these Step nodes 2002 causes detailed information about the selected step to be displayed in the results window 1608. Step information that can be displayed in this manner can include, but is not limited to, a natural language description of the step as well as process or control parameters for the step (e.g., process temperatures, flow directions, linear velocities, pH levels, mixing rates, mixing times, conductivities, paus times, etc.). This information can be used by the manufacturing entity 214 to configure its control devices and machines to execute the manufacturing process described by the document 204. Some of this step information can be obtained from tables that were included in the original technology transfer document 204, and which were identified by the conversion component 108 as containing relevant process parameters for the corresponding step.

Since the navigation tree 1604 reflects the hierarchical structure of the underlying model 208, the tree 1604 conforms to the industrial standard (e.g., ISA-88) in which the model 208 is formatted. This allows a user familiar with the industrial standard to easily browse and locate element of interested within the tree 1604 by navigating a standardized organization of hierarchical layers (e.g., industrial enterprise, plant, area, production line, machine, device, etc.).

Figure 21:
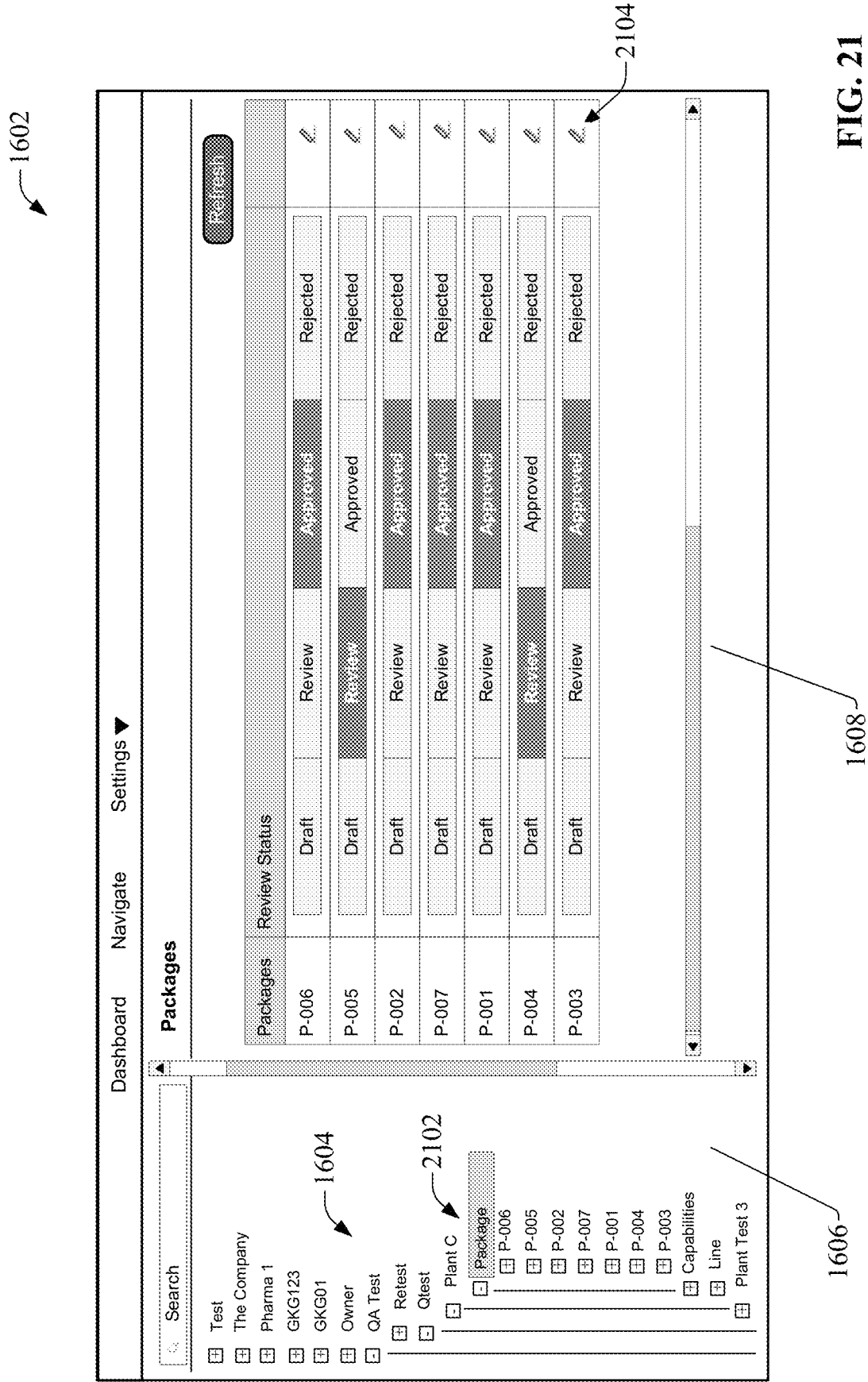
FIG. 21 is a view of the dashboard interface in which aggregate review statuses of multiple packages are displayed.

During the review phase, the reviewers can browse the content of the package as described above and submit results of their review—e.g., approved or rejected—to the system 102, which tracks the review status of each submitted package. FIG. 21 is a view of interface 1602 in which aggregate review statuses of multiple packages are displayed. In this example, selection of a Packages node 2102 below a selected plant facility (e.g., Plant C) in the navigation tree 1604 causes a list of active packages associated with plant to be displayed in the results window 1608, together with each package's current review status (e.g., Draft, Review, Approved, or Rejected). In some configurations, the package management component 116 may assign an Approved status to a package only if all designated reviewers of the package have submitted an Approved status for the package. If one or more designated reviewers submits a Rejected status for the package, the package management component 116 assigns a Rejected status to the package. In some embodiments, a reviewer can submit his or her review status via interaction with the review status display illustrated in FIG. 21; e.g., by selecting an edit icon 2104 next to the relevant package to invoke a status submission window.

In some embodiments, reviewers may also attach comments or submit edits to selected portions of the package via interaction with interface 1602. Once submitted, these comments or edits can be viewed by other reviewers. Example comments or edits can include, for example, correction of errors found in the recipe or manufacturing process for the product, concerns regarding clarity or accuracy of images that are associated with the package or its manufacturing process, or other such submissions.

Figure 22:
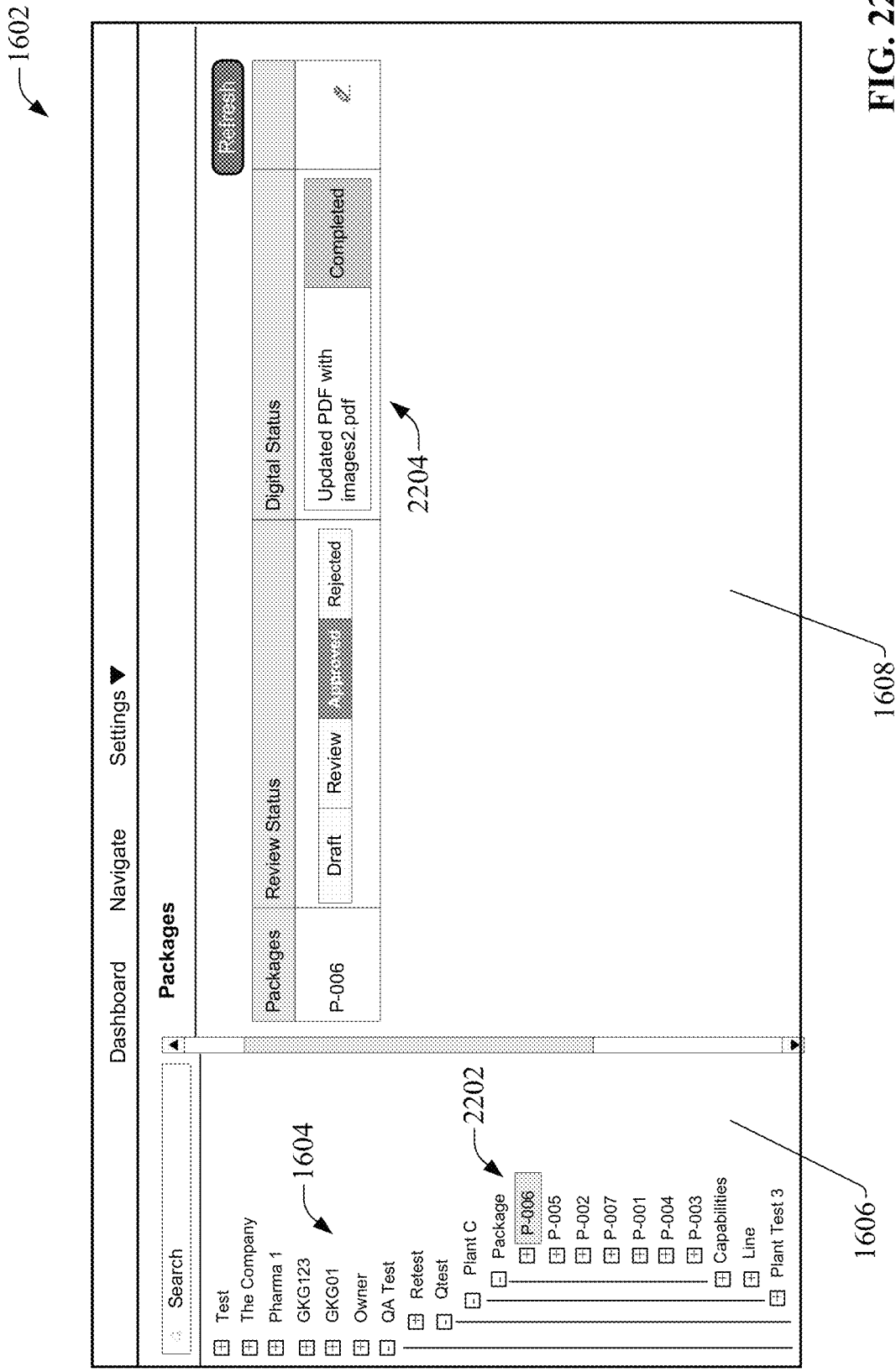
FIG. 22 is a view of the dashboard interface in which the user has selected a specific package node in the navigation tree.

FIG. 22 is a view of interface 1602 in which the user has selected a specific package node 2202 in the navigation tree 1604, which causes review status information for the selected package to be displayed in the results window 1608. In addition to displaying the current review status of the selected package, the results window 1608 also displays a document selection control 2204 that allows the user to open and view the original technology transfer document 204 that was submitted for the package.

Once a package has passed all reviews and received Approved status, the technology transfer system 102 can make the approved package available to the designated plant facilities for use in manufacturing the corresponding product. In some scenarios, this may involve making the package accessible to users of other user roles (e.g., plant managers, engineers, operators, etc.) who are responsible for putting the product into production at the plant facility.

Figure 23:
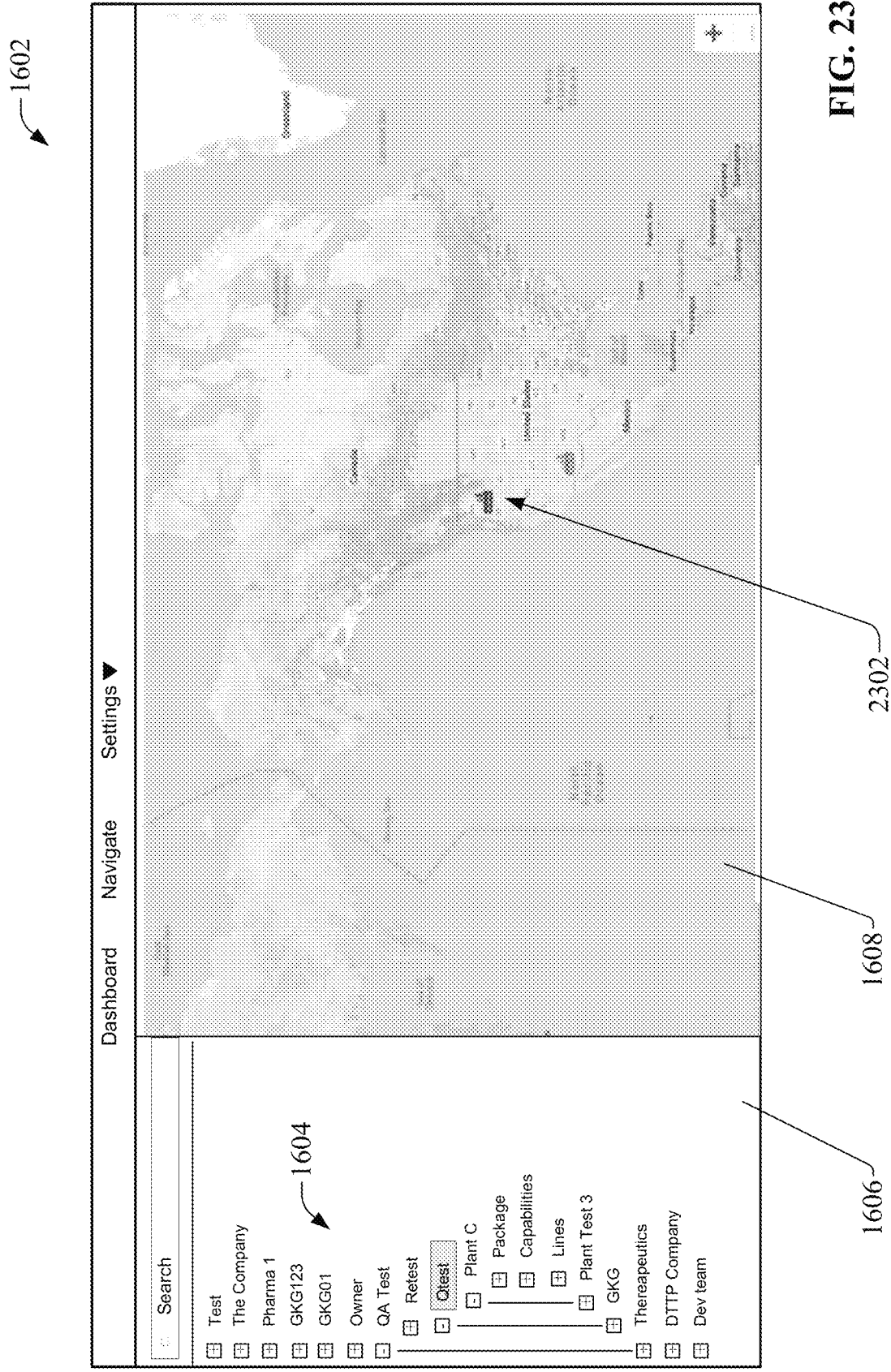
FIG. 23 is a view of the dashboard interface in which a geographical view of available plant facilities is rendered in the results window.
Figure 24:
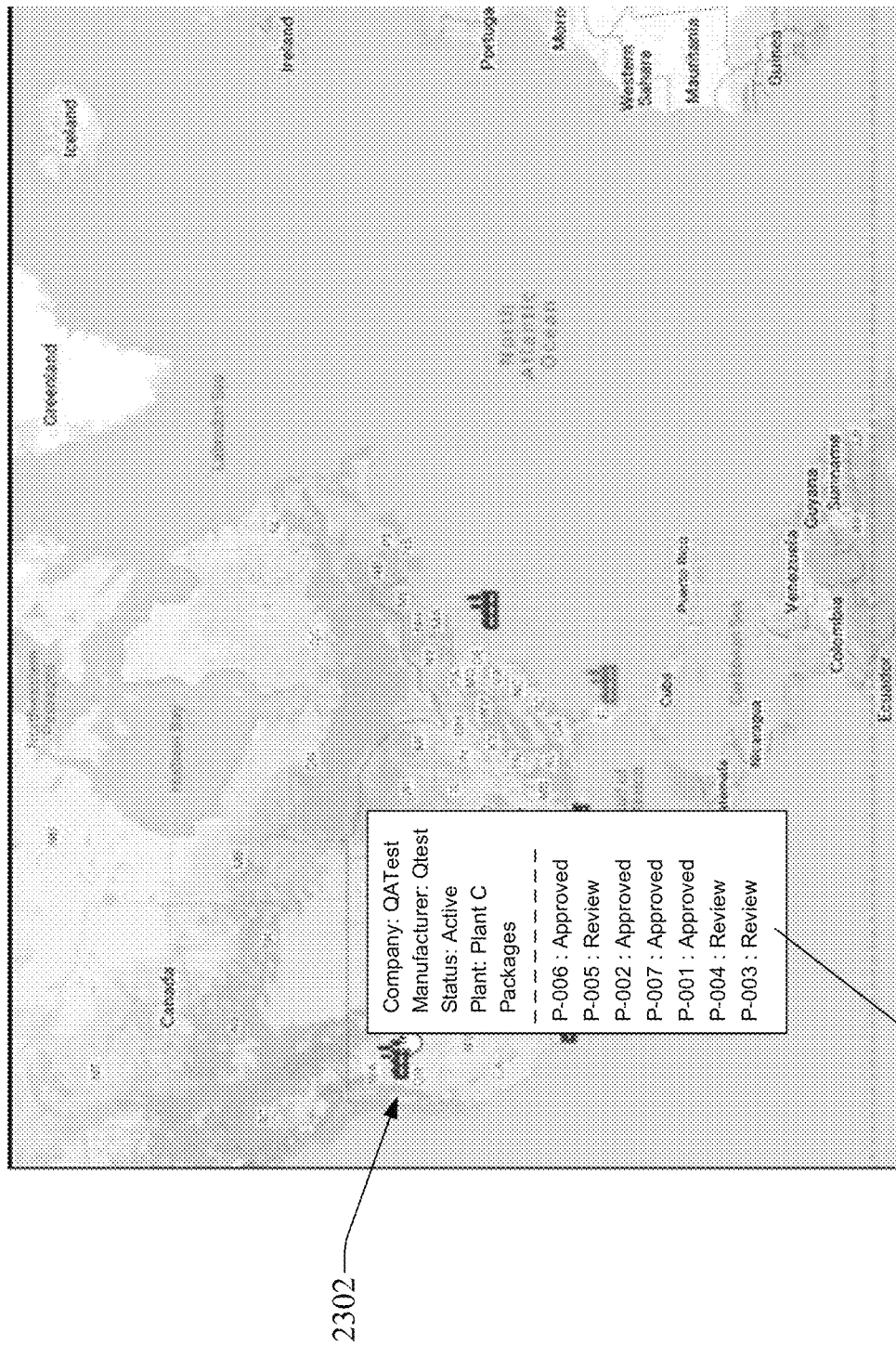
FIG. 24 is a view of a geographical map displayed by the dashboard interface in which the user has hovered a cursor over a selected one of the plant icons.
Figure 25:
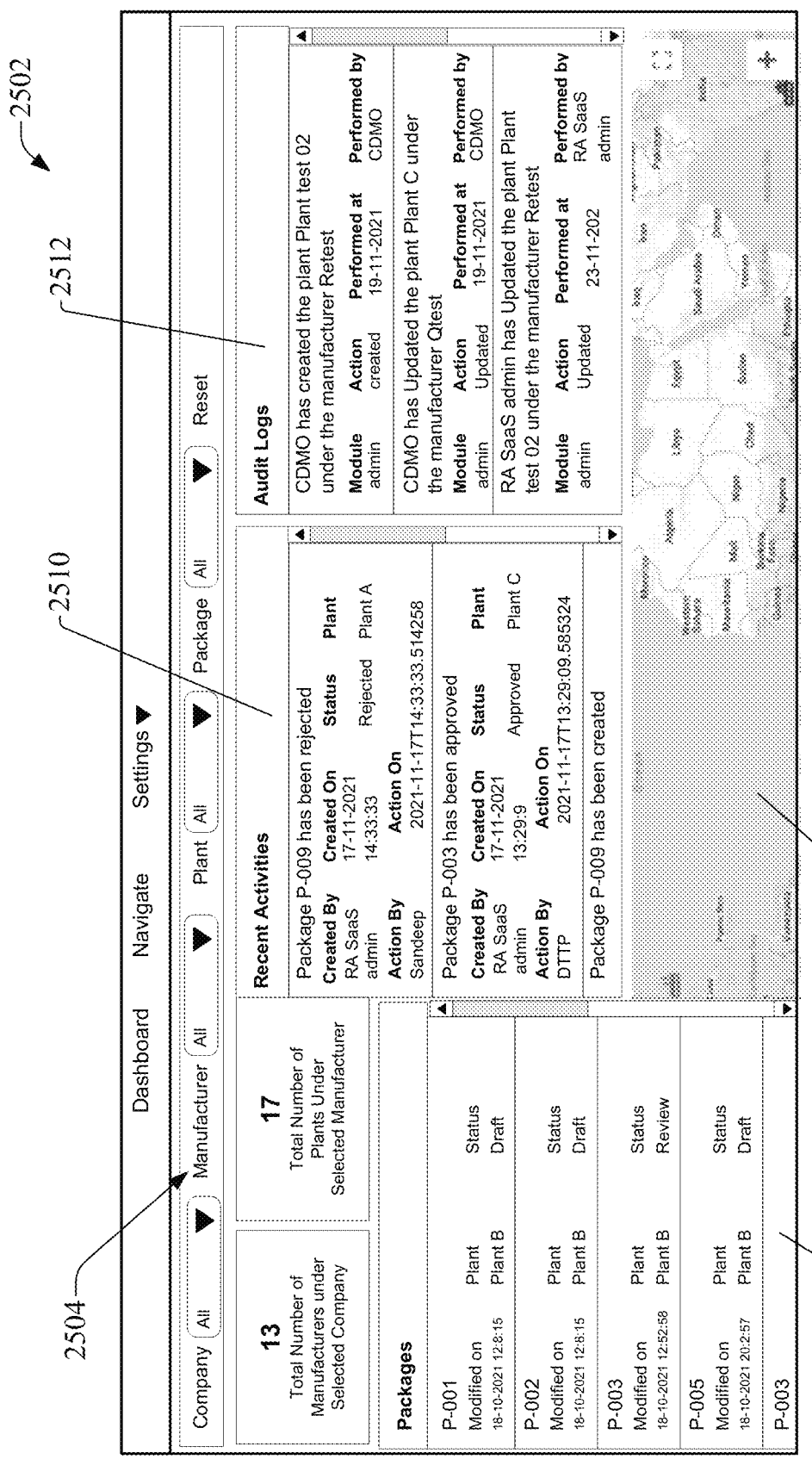
FIG. 25 is an example dashboard that can be generated by the technology transfer system and used to browse summary information for selected companies, manufacturers, plants, and packages.

FIGS. 23-25 are other example dashboards that can be generated by user interface component 104 and used to browse the ecosystem of manufacturing entities and packages that have been submitted to and registered with the technology transfer system 102. FIG. 23 is a view of interface 1602 in which a geographical view of available plant facilities is rendered in the results window 1608. In some embodiments, this geographical view can be invoked and used to browse the plant facilities that have a contractual relationship with the technology owner 202 based on the geographical locations of those plant facilities. To this end, a map is rendered in the results window 1608, and selection of a manufacturing entity within the navigation tree 1604 causes each plant facility owned by the selected manufacturing entity to be rendered on the map as a plant icon 2302 placed at the location of the physical plant. Selection of a specific plant facility in the navigation tree 1604 can cause the corresponding plant icon 2302 to be highlighted on the map.

FIG. 24 is a closer view of the geographical map displayed by interface 1602, in which the user has hovered a cursor over a selected one of the plant icons 2302. Hovering a curser over a plant icon 2302 in this manner can cause a summary window 2402 for the corresponding plant to be overlaid on the map near the selected icon 2302. The summary window 2402 can include such information as the manufacturing entity that owns the plant, the company (technology owner) having a business relationship with manufacturing entity, and a name and current status of the plant. The summary window 2402 can also list the names of all packages that have been assigned to the plant and the respective review statuses of those packages.

FIG. 25 is an example dashboard 2502 that can be generated by the user interface component 104 and used to browse summary information for selected companies, manufacturers, plants, and packages. In this example, a selection bar 2504 is rendered near the top of the dashboard 2502 comprising drop-down selection boxes for selecting a desired company (technology owner), manufacturer, plant, and/or package to be viewed. Selections made in the selection bar 2504 filter the information presented on the dashboard 2502. The selection boxes are populated with selectable entities registered in each category. The selectable entities available in each selection box are also filtered based on the role of the user, such that only those entities that are within the scope of the user's access privileges (as defined by the user's assigned role or affiliation) are made available for selection. For example, a user affiliated with the technology owner 202 may be permitted to select from among all registered manufacturing entities having a business relationship with the technology owner 202, while a user affiliated with a manufacturing entity 214 may only be permitted to view information that is within the scope of that manufacturing entity 214 while being denied the ability to view information for other manufacturing entities. The selections may also be further filtered based on the user's role within the organization.

Dashboard 2502 comprises information windows that display respective different types of information based on the filter criteria set using the selection boxes. For example, for a selected company or technology owner 202, the dashboard 2502 may indicate a total number of manufacturing entities that are partnered with the company. Similarly, for a selected manufacturing entity, the dashboard 2502 may indicate a total number of plants owned by that manufacturer.

A Package summary window 2506 can list a filtered set of packages based on the filtering criteria, together with summary information for each package (e.g., a package name, the date of the most recent modification to the package, a plant to which the package has been assigned, a review status of the package, etc.). A Recent Activities window 2510 can display a log of most recent activities for the selected company, manufacturer, plant, and/or package. In an example embodiment, each entry can comprise information relating to a status update for a package, indicating when a package has been created, rejected, or approved. Each entry can also include a time and date of the status change, an identity of a user who initiated the status change, or other such informant.

An Audit Log window 2512 can display a log of auditing events relevant to the selected company, manufacturer, plant, and/or package. This audit information can log updates that were performed on the model 208 itself, including times and dates at which nodes are created or modified (e.g., manufacturer, plant, or package nodes), as well as identities of the users who implemented the modifications. Dashboard 2502 can also include a map window 2508 similar to that illustrated in FIG. 23, which renders a set of plant icons—filtered in accordance with the selection criteria—at respective map locations corresponding to the physical locations of those plants.

In some embodiments, the package management component 116 can support the use of blockchain technology to record the approved package data in a secure, immutable format. In such embodiments, the package management component 116 can also record audit information for the package in a blockchain ledger. This audit information can comprise a log of modifications to the technology transfer document 204, identities of the users who implemented the modifications, and the time and date of the modifications. Recording this information in a blockchain ledger yields a secure and immutable edit history for the document, while permitting the document to be modified in a regulated manner.

Figure 26:
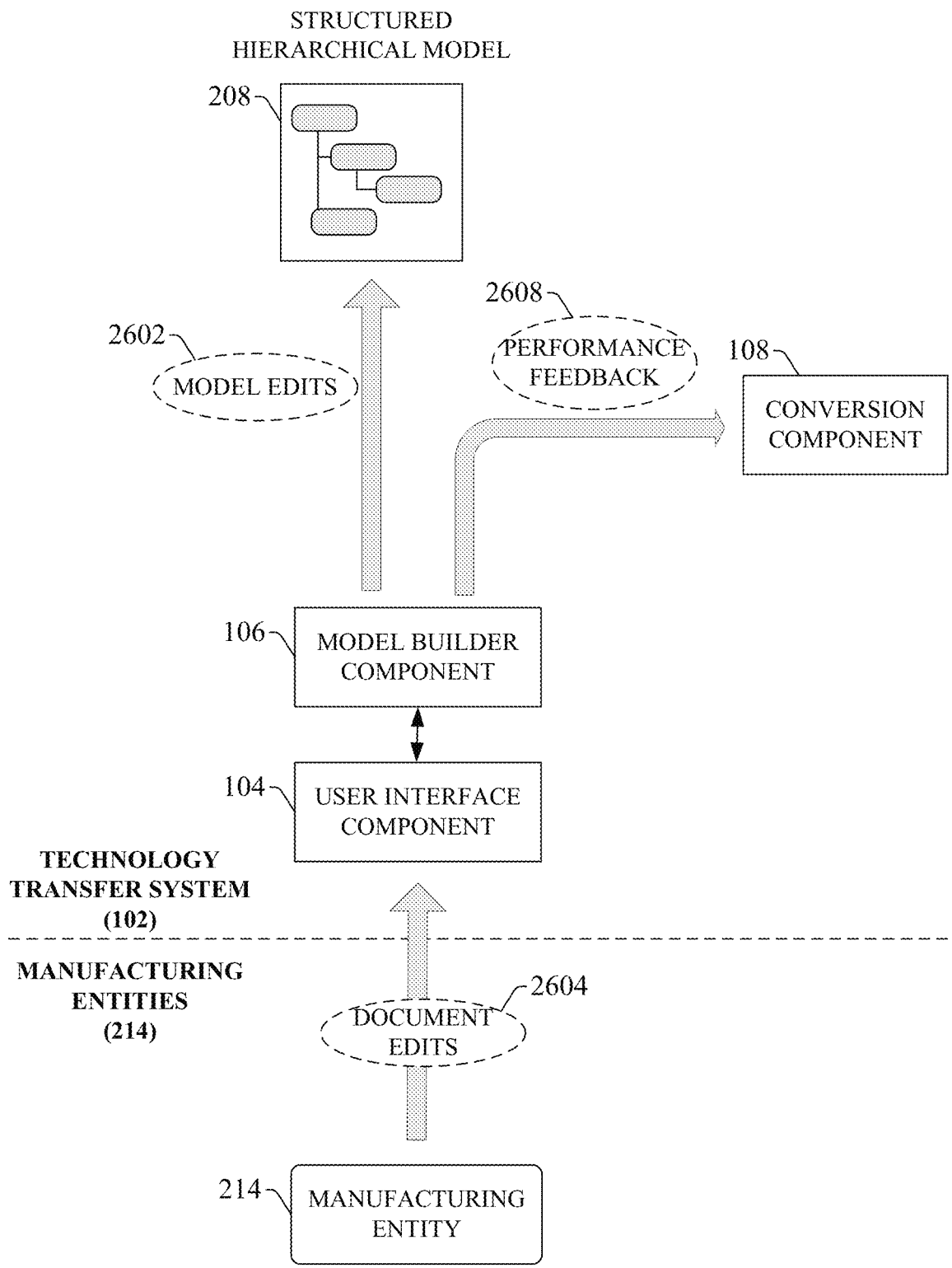
FIG. 26 is a diagram illustrating submission of document edits by a reviewer at a manufacturing entity.

As noted above, edits or feedback can be submitted to a package model 1106 during the review process via interactions with interface 1602. In some embodiments, the system 102 can translate some or all of these edits to performance metrics that can be provided as feedback to the conversion component 108 to improve subsequent translations of technology transfer documents 204. FIG. 26 is a diagram illustrating submission of document edits 2604 by a reviewer at a manufacturing entity 214. During the document review process, the reviewer may submit edits 2604 to the translated package model 1106 to alter descriptive text, modify process control parameters, re-order steps of a manufacturing stage, re-organize the hierarchical arrangement of nodes that make up the package model 116, or implement other such updates. Some of these edits 2604, such as re-ordering of process steps, may result in modification of the hierarchical structure of the package model 1106 or otherwise serve to correct an error in the translation from the original technology transfer document 204 to the package model 1106.

Authorized edits 2604 submitted to the system 102 are applied to the package model 1106 (a subset of the larger aggregate model 208) by the model builder component 106. Additionally, if any of the edits 2604 correct a mis-translation of the original technology transfer document 204, these edits 2604 can translated to performance feedback 2608 and provided to the conversion component 108. This performance feedback 2608 can modify the parsing engine or algorithms used by the conversion component 108 to generate the raw object model 1302 for a technology transfer document 204, or to generate the structured object model 1304. In particular, the performance feedback 2608 can configure the conversion component 108 to modify its translation algorithms so that subsequent document translations will preemptively implement the edit submitted by the reviewer (or an analogous edit depending on the nature of the original document 204). In this way, the package review process can also serve as a means for collecting performance metrics for the conversion component 108, which improve the accuracy of subsequent translations of technology transfer documents 204 to package models 1106.

Figure 27:
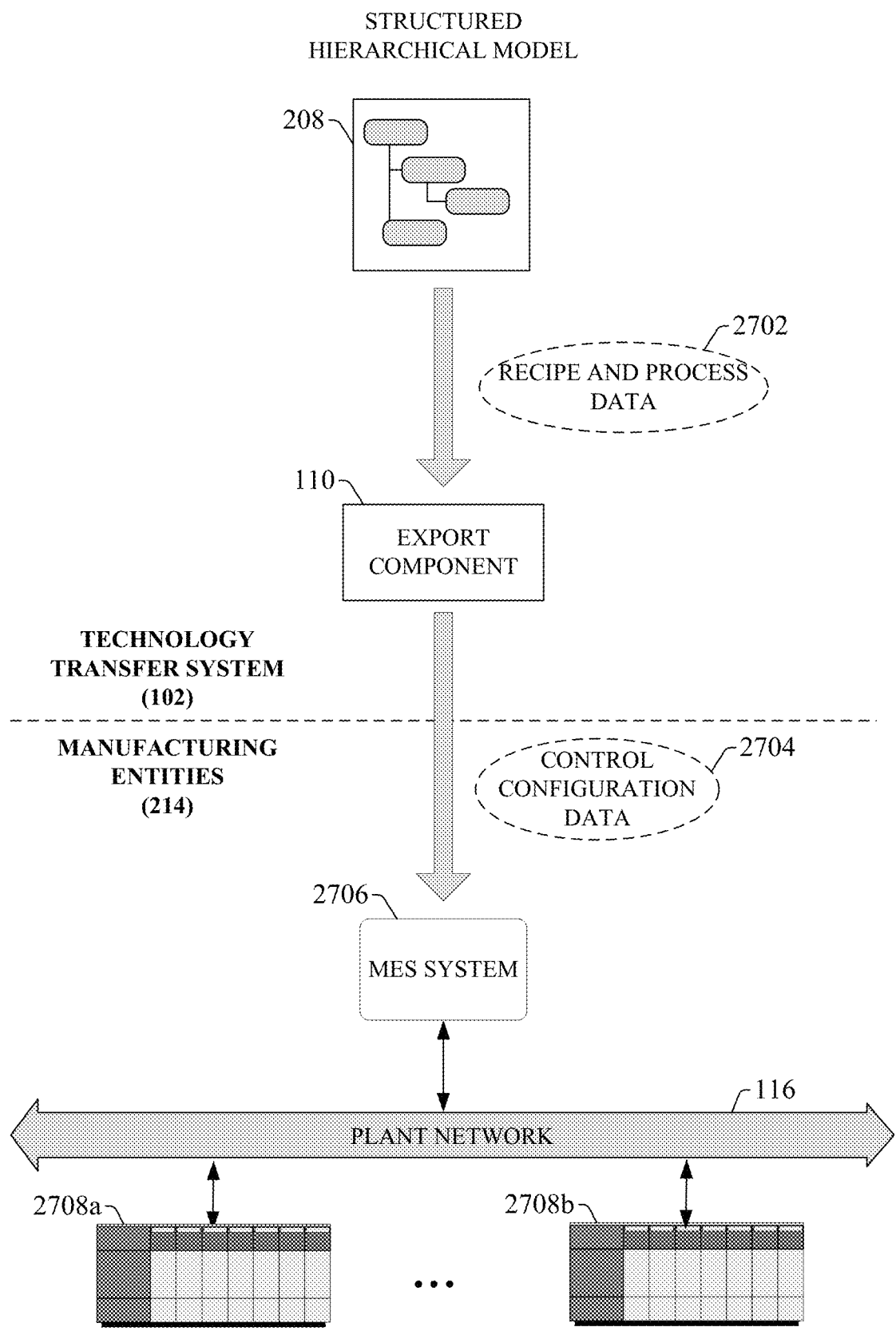
FIG. 27 is a diagram illustrating export of control configuration data to an MES system of a manufacturing entity.

Package data encoded in a package model 1106 can be exported to and consumed by various types of devices and systems to facilitate manufacture of the product defined by the originating technology transfer document 204. FIG. 27 is a diagram illustrating export of control configuration data 2704 to an MES system 2706 of a manufacturing entity 214. Once a package has been finalized and approved, data relating to the product defined by the package—including recipe information; details of the manufacturing processes, stages, and steps for producing the product, etc.—is made available to users, devices, and systems at the manufacturing entities 214 that have been assigned the task of manufacturing the product. In addition to making this package information accessible and viewable by relevant users (e.g., via interface 1602), the system 102 can translate portions of the model data to control configuration data 2704 that can be used to configure MES systems, ERP systems, industrial control devices such as industrial controllers 2708, product lifecycle management (PLM) systems, or other such equipment.

To this end, the export component 110 can extract recipe and process data 2702 from the package model 1106—that is, data relating to the manufacturing process—and translate this data 2702 to control configuration data 2704 formatted in accordance with a target device or system to which the configuration data 2704 will be sent. In the illustrated example, the export component 110 outputs the control configuration data to an MES system 2706 associated with a manufacturing entity 214, which performs supervisory monitoring and management of control operations on the control level. The configuration data 2704 provides the MES system 2706 with the recipe information, control parameters, step sequences, or other such process information for manufacturing the product. Based on this configuration data 2704, the MES system 2706 can direct control devices executing in the plant facility, such as industrial controllers 2708, to control their respective industrial assets in accordance with the production specifics encoded in the configuration data 2704.

Although FIG. 27 depicts configuration of an MES system 2706 using the control configuration data 2704, the technology transfer system 102 can export control configuration data 2704 to various types of industrial control devices or systems as needed, depending on how the manufacturing process for the product is to be partitioned among control systems, plant facilities, and manufacturing entities. For example, as noted above, a technology owner 202 may choose to partition the stages of a multi-stage manufacturing process between two or more different production lines, plant facilities, or manufacturing entities. To partition a process in this manner, a user affiliated with the technology owner 202 can interact with interface 1602 to designate each Stage node 1902 of the package model 1106 to a selected plant facility or production line. Based on these designations, users affiliated with the respective plant facilities are permitted to access and view the portions of the package model 1106 corresponding to their designated stage of the process, and in some scenarios may be prevented from accessing portions of the model 1106 that have been designated to other manufacturing entities 214 (thereby protecting the intellectual property of the technology owner by preventing any single manufacturing entity from viewing details of the manufacturing process in its entirety). Additionally, the export component 110 can export control configuration data 2704 obtained from the model 1106 to control devices and systems associated with the designated facilities or production areas, such that each target facility receives configuration data 2704 obtained solely from the portions of the model 1106 that have been designated to that facility. Export component 110 can be configured to support any suitable security protocol to ensure that the control configuration data 2704 is delivered securely to its target devices and systems.

Figure 28:
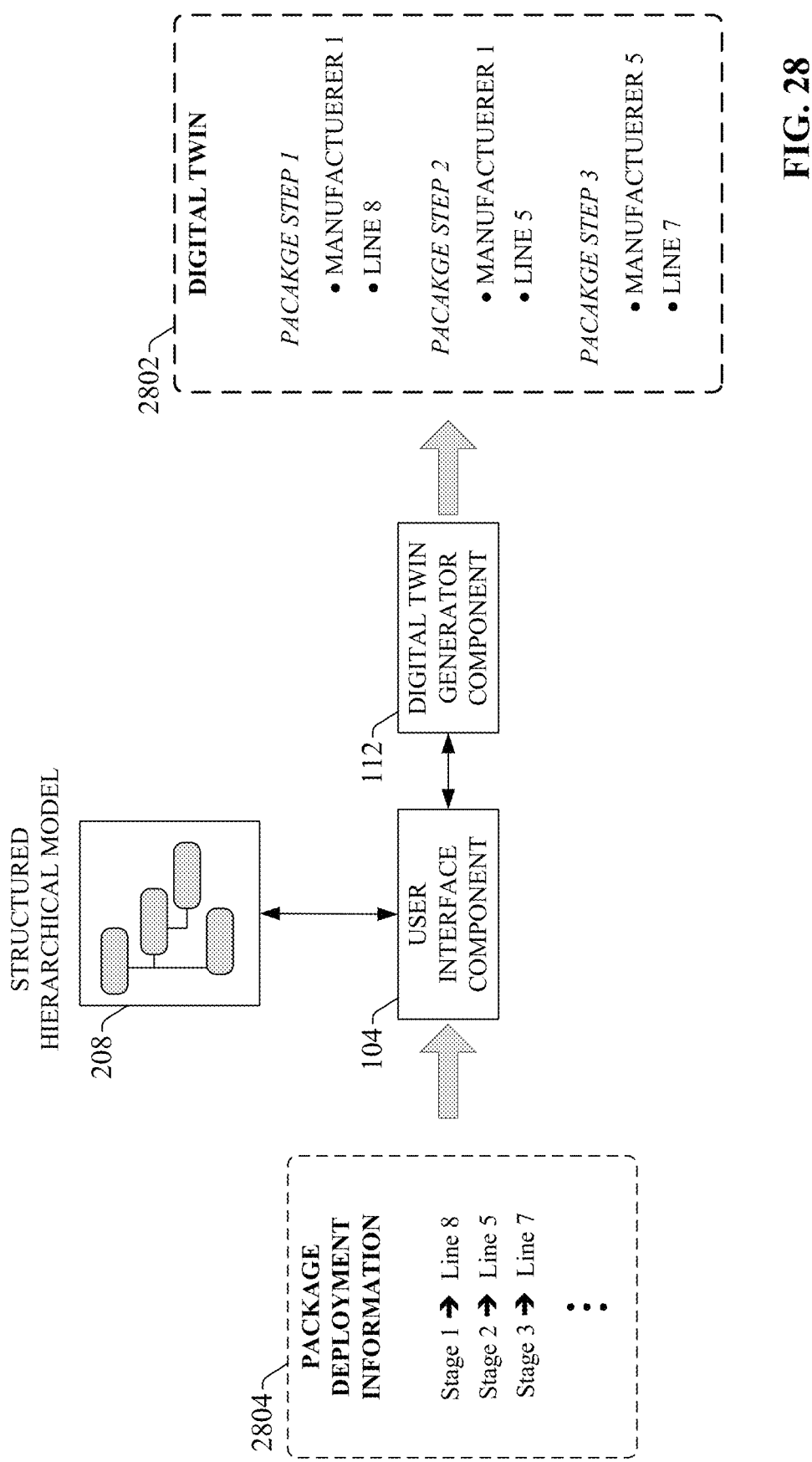
FIG. 28 is a diagram illustrating creation of a digital twin of a manufacturing process represented by a package model.

Some embodiments of technology transfer system 102 can also support creation and simulation of a digital twin of the package manufacturing process represented by the package model 1106, which can allow users to validate operation of the manufacturing process by the designated manufacturing entities 214 prior to carrying out the manufacturing process on the physical industrial assets. FIG. 28 is a diagram illustrating creation of a digital twin 2802 of a manufacturing process represented by a package model 1106. As noted above, a technology owner 202 can designate selected manufacturing processes or stages defined in the package model 1106 to respective different production lines; e.g., by submitting package deployment information 2804 to the system 102 (via interface 1602) that assigns nodes of the navigation tree 1604 representing the processes or stages to selected production lines. In the example depicted in FIG. 28, the user has assigned stages 1-3 of a manufacturing process to Production Lines 8, 5, and 7, respectively. These different production lines may reside in the same plant facility associated with a single manufacturing entity 214 or may be geographically distributed among different plant facilities associated with the same manufacturing entity 214 or multiple different manufacturing entities 214.

Once this partitioning of the manufacturing process has been defined, the user may choose to generate a digital twin 2802 and simulate operation of the manufacturing process prior to execution on the physical production lines. To this end, a digital twin generator component 112 can generate this digital twin 2802 based on the package deployment information 2804 submitted by the user—which defines which production lines defined in the model 208 are to execute the respective stages of the process—and information about the industrial equipment (e.g., mixers, presses, ovens, etc.) that make up those production lines. Returning briefly to the example model 208 illustrated in FIG. 14, the digital twin generator component 112 can obtain capability or specification information for the industrial equipment on each of the designated production lines from the Lines layer 1410 of the model 208 and use this equipment capability information to generate simulation-capable digital models of the equipment as part of the digital twin 2802. Example equipment capability information that can be obtained from the model 208 and used by the digital twin generator component 112 to generate the digital twin 2802 can include, but is not limited to, operating speeds, product throughput capacities, rated temperatures or flows, or other such equipment capability information. These digital equipment models can also be configured in accordance with any control or process parameters defined by the process steps that have been assigned to the corresponding equipment (that is, the control or process parameters obtained from the original technology transfer document and included in the package model 1106). The digital twin generator component 112 can aggregate equipment models for a given production line to yield a simulation capable production line model as part of the digital twin 2802.

Digital twin generator component 112 also assigns, to each of the production line models, the one or more stages or operations of the manufacturing process that have been assigned to that production line, as defined by the user-provided package deployment information 2804. These assignments configure the digital twin 2802 to simulate execution of each of the stages or operations of the manufacturing process by their assigned production lines. If the designated production lines encompass multiple different, geographically diverse production facilities, the scope of the digital twin 2802 can include transportation of product between plant facilities as part of a sequential staging of the product. Distances between these different plant facilities can be obtained from the model 208 based on the registered locations of the relevant plants and encode in the digital twin 2802 so that transportation times can be simulated.

Figure 29:
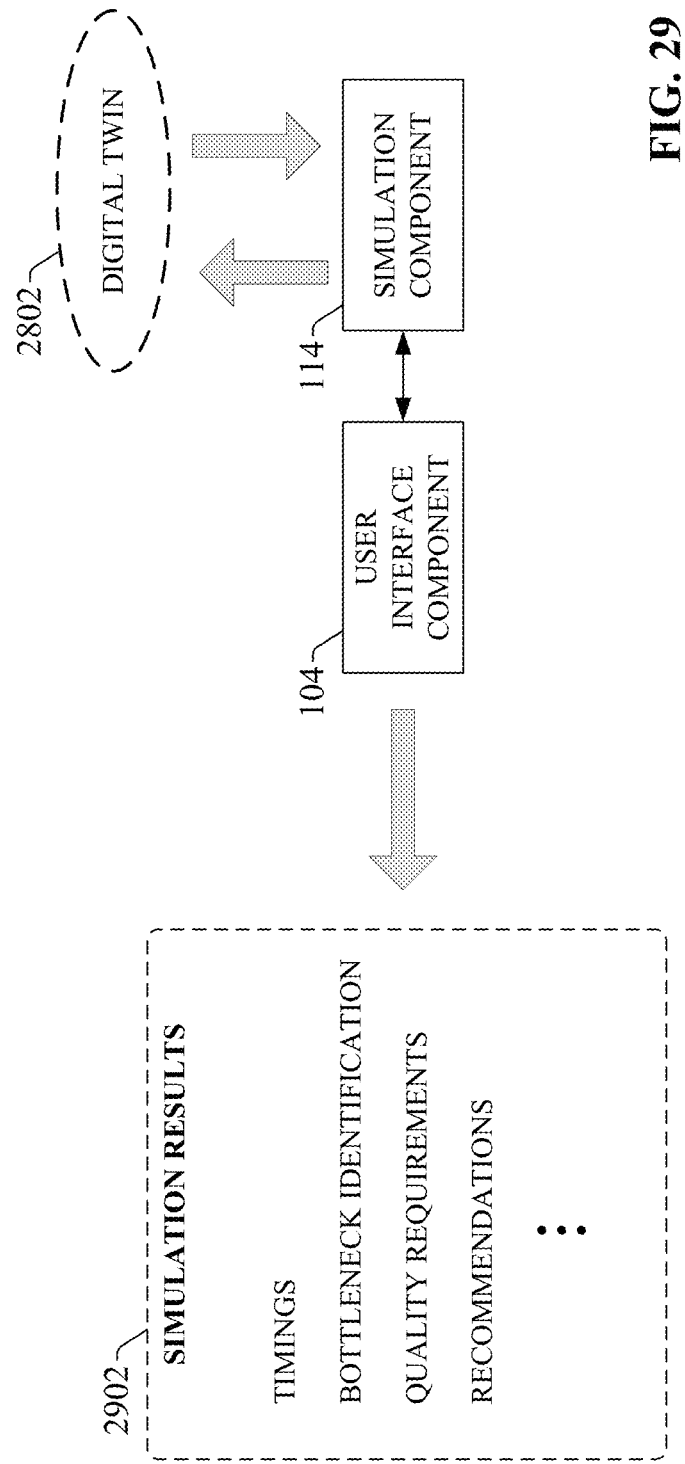
FIG. 29 is a diagram illustrating execution of the digital twin by the technology transfer system.

Once the digital twin 2802 has been created, the system's simulation component 114 can execute a simulation of the digital twin 2802 to predict operation of the manufacturing process by the designated production lines. FIG. 29 is a diagram illustrating execution of the digital twin 2802 by the technology transfer system 102. The simulation component 114 can consider the capabilities and specification data for the modeled industrial equipment together with the operations required of that equipment—as dictated by the portions of the manufacturing process to be carried out by the respective pieces of equipment—to simulate manufacture of the product and generate simulation results 2902 that quantify various aspects of the simulated process. Example simulation results 2902 that can be generated by the simulation component 114 based on simulation of the digital twin 2802 can include, but are not limited to, timings of various aspects of the product, identification of bottlenecks in the production flow, product quality estimations, estimated product throughput or output, or other such results 2902.

In some embodiments, the simulation component 114 can also be configured to generate recommendations for improving the manufacturing process based on the simulation and information contained in the model 208. In this regard, the recommendations can be designed to improve a performance metric for the manufacturing process, or to otherwise bring the performance metric within a specified range of acceptability. In an example scenario, the simulation component 114 may determine that the predicted rate of product throughput can be improved if a stage of the process that has been assigned to a first production line is instead carried out on a second production line capable of performing the same operation more quickly or with less potential machine downtime. In making this assessment, the simulation component 114 can refer to the model 208 to identify other available production lines with similar but improved capabilities. The user interface component 104 can render these recommendations, as well as other simulation results 2902, on a client device associated with an authorized user, who may choose to modify the partitioning of the package manufacturing process between production lines based on assessment of the simulation results 2902. In general, the manufacturing process for the package can be validated by the simulation of the digital twin 2802 prior to deploying the process to the physical production lines.

The technology transfer system described herein can simplify and automate many aspects of the technology transfer process using a centralized platform for translating, sharing, editing, and tracking technology documentation. The system's document translation features can transform the content of a technology transfer document to a structured hierarchical object-based model that can then be browsed and viewed by relevant parties. The system enforces role-based access privileges to the package model, affording a technology owner a great degree of control over the distribution of the document's contents. The system also manages and tracks approval statues for the document. Once approved, the system can export recipe data or control configuration information, including process control parameters, to industrial control systems to facilitate configuring those systems to manufacture the product defined by the document.

FIGS. 30-32*b* illustrate methodologies in accordance with one or more embodiments of the subject application. While, for purposes of simplicity of explanation, the methodologies shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Figure 30:
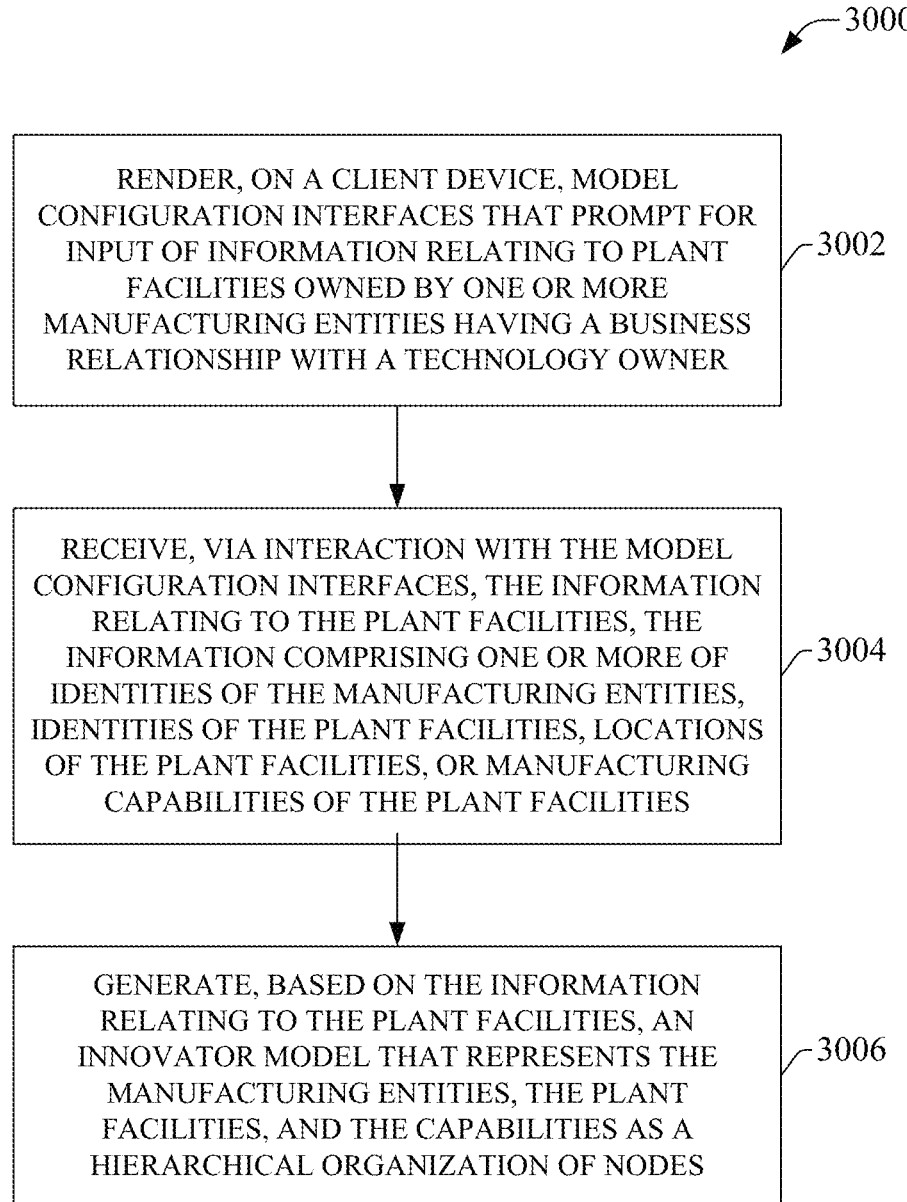
FIG. 30 is a flowchart of an example methodology for creating an innovator model that defines an ecosystem of manufacturing entities that are contracted with a technology owner to manufacture products.

FIG. 30 illustrates an example methodology 3000 for creating an innovator model that defines an ecosystem of manufacturing entities that are contracted with a technology owner to manufacture products. Initially, at 3002, model configuration interfaces are rendered on a client device associated with an authorized user affiliated with the technology owner. The model configuration interfaces prompt for input of information relating to plant facilities owned by one or more manufacturing entities having a business relationship with the technology owner.

At 3004, information relating to the plant facilities is received via interaction with the model configuration interfaces. This information can include, but is not limited to, identities of the manufacturing entities, identities and locations of plant facilities operated by the manufacturing entities, manufacturing capabilities of the plant facilities, production lines and associated industrial equipment in operation at the respective plant facilities, or other such information.

At 3006, an innovator model is generated based on the information received at step 3004. The innovator model represents the manufacturing entities, their associated plant facilities, and the capabilities of those facilities as a hierarchical organization of nodes or objects.

Figure 31A:
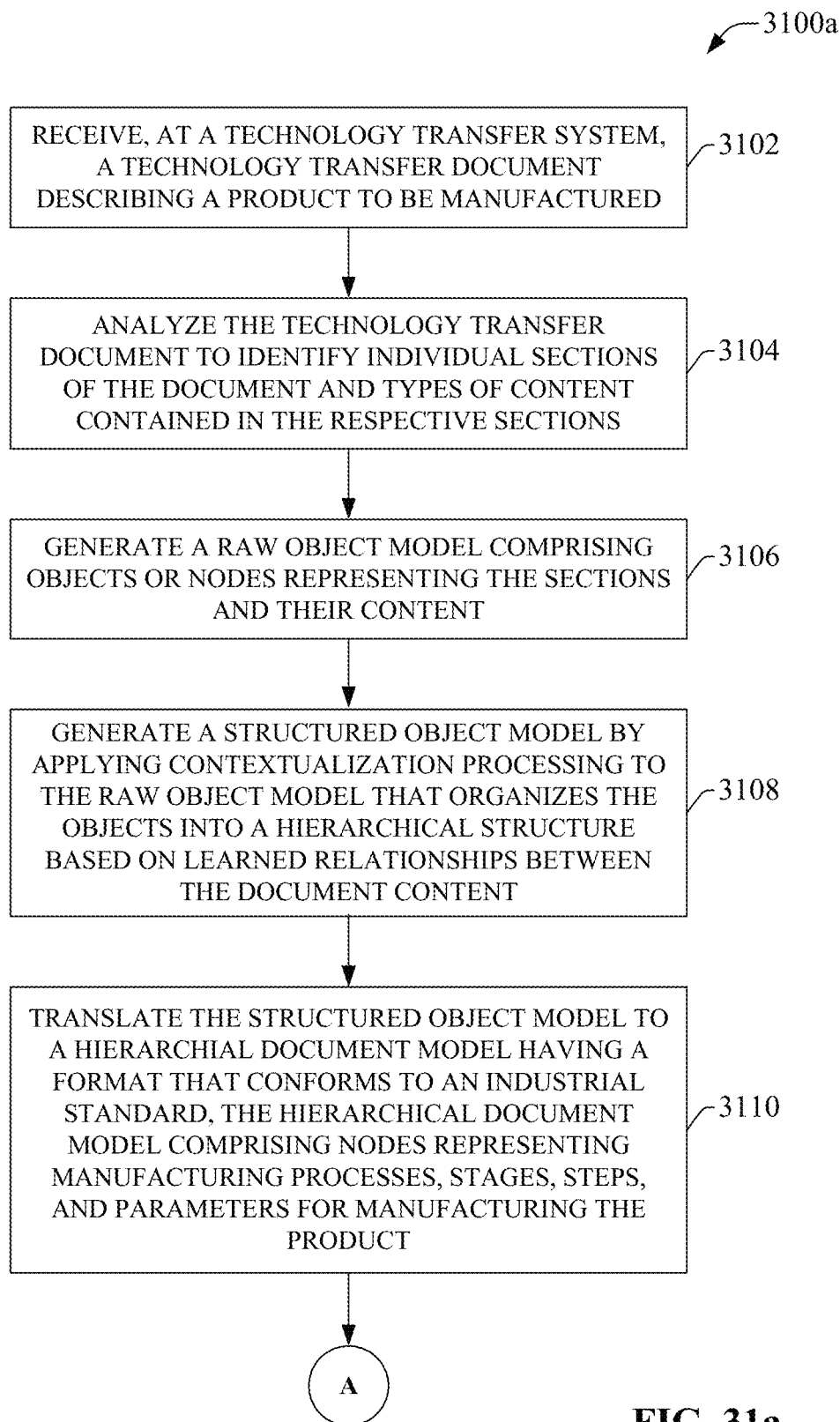
FIG. 31a is a flowchart of a first part of an example methodology for translating a technology transfer document to a digitized hierarchical object model notation.

FIG. 31*a* illustrates a first part of an example methodology 3100*a* for translating a technology transfer document to a digitized hierarchical object model notation. Initially, at 3102, a technology transfer document describing a product to be manufactured is received at a technology transfer system. The technology transfer document can be submitted as a natural language document in any suitable file format (e.g., a PDF document) and can comprise sections and sub-sections delineated by headers or titles. The sections and subsections describe a product to be manufactured (e.g., a pharmaceutical product) and detailed information conveying how the product is to be manufactured. The document can include sections describing the stages of the manufacturing process and the steps for carrying out the respective stages. The document can also include values of process parameters associated with respective steps of the process, as well as any relevant tables or charts.

At 3104, the technology transfer document is analyzed to identify individual sections of the document and types of content contained in the respective sections. This analysis can include, for example, applying natural language processing to the text of the document to identify and delineate the various sections of the document based on header text, tags embedded in the document, recognized document formatting, or other such document characteristics. At 3106, a raw object model is generated comprising objects or nodes representing the sections of the document and their content, as identified based on the analysis applied at step 3104. The raw object model is an intermediate, uncontextualized representation formatted according to any suitable object notation, such as JavaScript Object Notation (JSON). The raw object model can comprise objects or nodes representing the various sections and sub-sections discovered in the document based on the analysis of step 3104.

At 3108, a structured object model is generated by applying contextualization processing to the raw object model created at step 3106. The structured object model organizes the objects into a hierarchical structure based on learned relationships between content of the document. At 3110, the structured object model generated at step 3108 is translated to a hierarchical document model having a format that conforms to an industrial standard, such as ISA-88. The document model comprises nodes or objects representing manufacturing processes, stages, steps, and parameters for manufacturing the product. The document model can be browsed using suitable user interfaces to view respective sections of document content.

The resulting document model can also be integrated into the innovator model generated using methodology 3000 described above in connection with FIG. 30 by assigning respective processes or steps of the manufacturing process defined in the document model to selected production lines defined in the innovator model. The resulting aggregate model can be browsed to view information about the plant facilities that make up the ecosystem of manufacturing entities and the document models (packages) associated with the respective plant facilities.

Figure 31B:
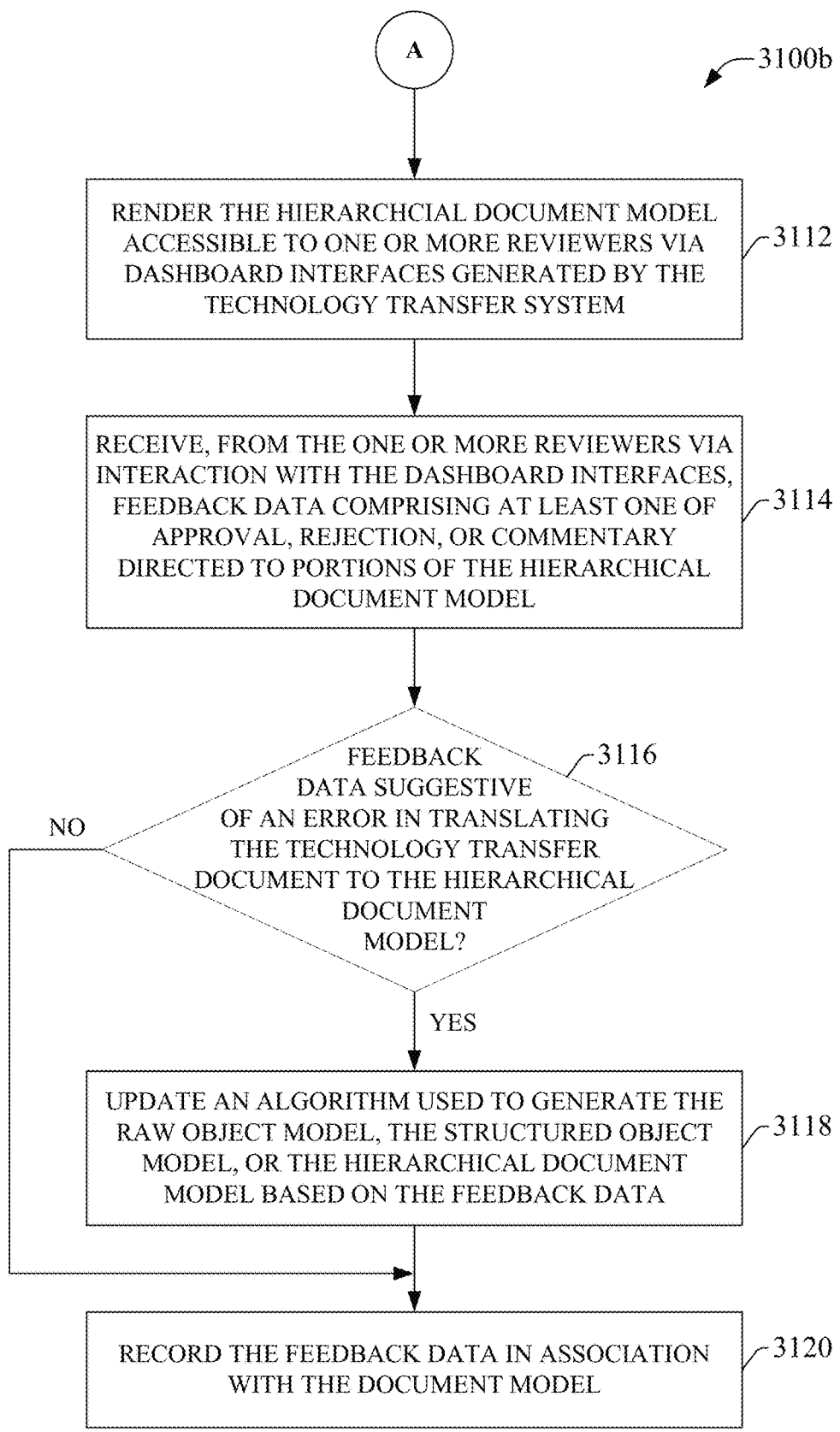
FIG. 31b is a flowchart of a second part of the example methodology for translating a technology transfer document to a digitized hierarchical object model notation.

The methodology continues with the second part 3100b illustrated in FIG. 31b. At 3112, the hierarchical document model generated at step 3110 is rendered accessible to one or more reviewers via dashboard interfaces generated by the technology transfer system. In this regard, the document model can be rendered as a browsable hierarchical navigation tree that allows the reviewers to locate, select, and view sections of the document, including descriptions of the product, descriptions of the manufacturing process, recipe information for manufacturing the product, charts, tables, control parameters associated with the manufacturing process, or other such content.

At 3114, feedback data is received from the reviewers via interaction with the dashboard interfaces. The feedback data comprises at least one of approval, rejection, or commentary directed to selected portions of the document model, or to the document model as a while. At 3116, a determination is made as to whether any of the feedback data received at step 3114 is suggestive of an error in translating the technology transfer document to the hierarchical document model (that is, errors in any of the steps 3104-3110). If any of the feedback data is suggestive of a translation error (YES at step 3116), the methodology proceeds to step 3118, where an algorithm or parsing engine used to generate any of the raw object model, the structured object model, or the hierarchical document model is updated based on the feedback data to improve the document translation process. At 3120, the feedback data is recorded in association with the document model. If the feedback data is not suggestive of an error in the translation process (NO at step 3116), the methodology proceeds directly to step 3120 without executing step 3118.

Figure 32A:
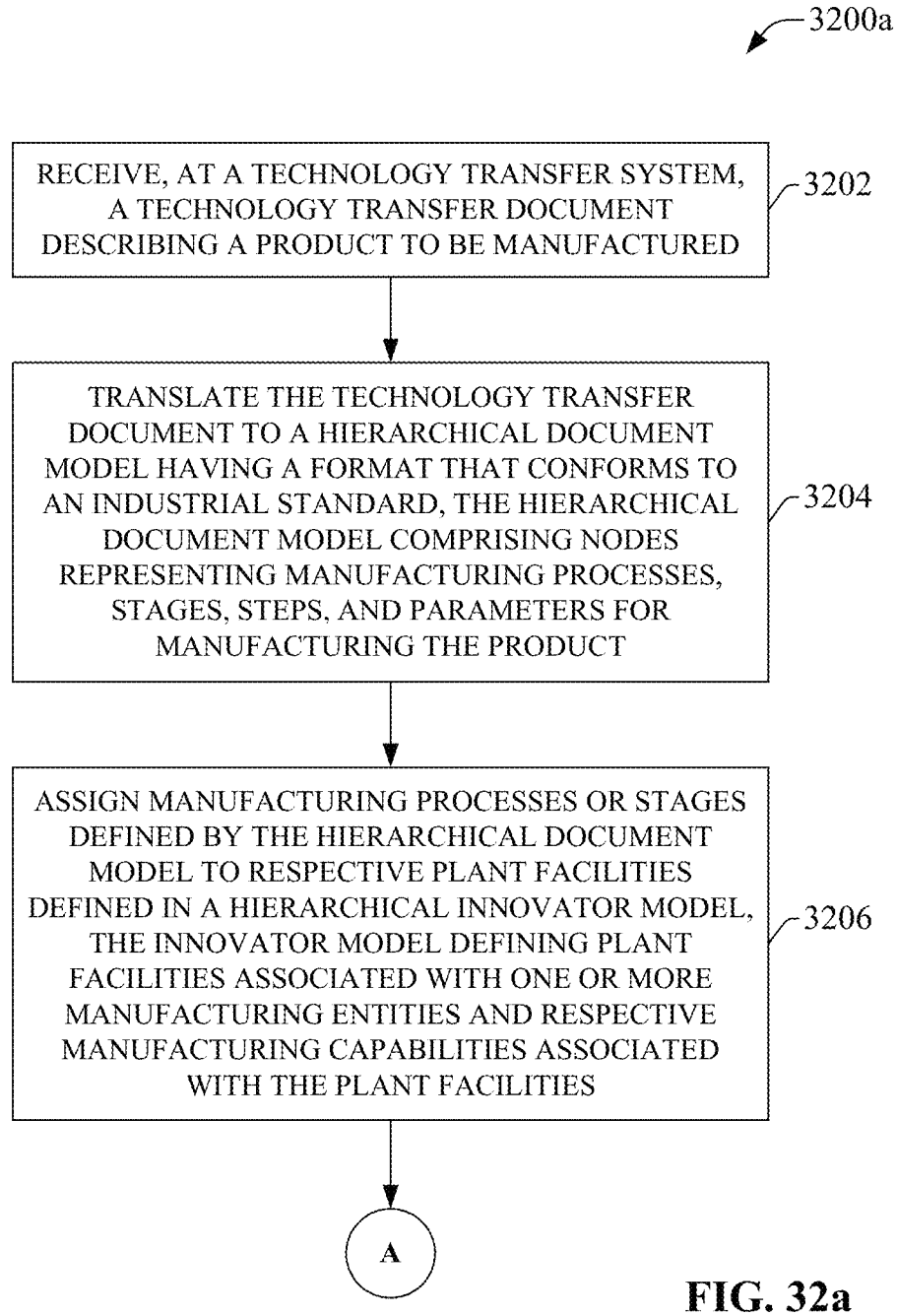
FIG. 32a is a flowchart of a first part of an example methodology for generating and simulating a digital twin of a manufacturing process based on information obtained from a translated technology transfer document.

FIG. 32a illustrates a first part of an example methodology 3200a for generating and simulating a digital twin of a manufacturing process based on information obtained from a translated technology transfer document. Initially, at 3202, a technology transfer document describing a product to be manufactured is received at a technology transfer system (similar to step 3102 of methodology 3100a). At 3204, the technology transfer document is translated to a hierarchical document model having a format that conforms to an industrial standard. The document model comprises nodes representing manufacturing processes, stages, steps, and parameters for manufacturing the product. Step 3204 can be executed, for example, using steps 3104-3110 of methodology 3100a.

At 3206, manufacturing processes or stages defined by the hierarchical document modal are assigned to respective plant facilities defined in a hierarchical innovator model. The innovator model can be created using methodology 3000 described above, and defines plant facilities associated with one or more manufacturing entities and respective capabilities associated with the plant facilities. The assignments can be made by an authorized user via interaction with an interface display that renders the innovator model as a hierarchical navigation tree and that allows the user to assign selected nodes of the document model representing manufacturing processes or stages to selected nodes of the innovator model representing the plant facilities that are to execute the processes or stages.

Figure 32B:
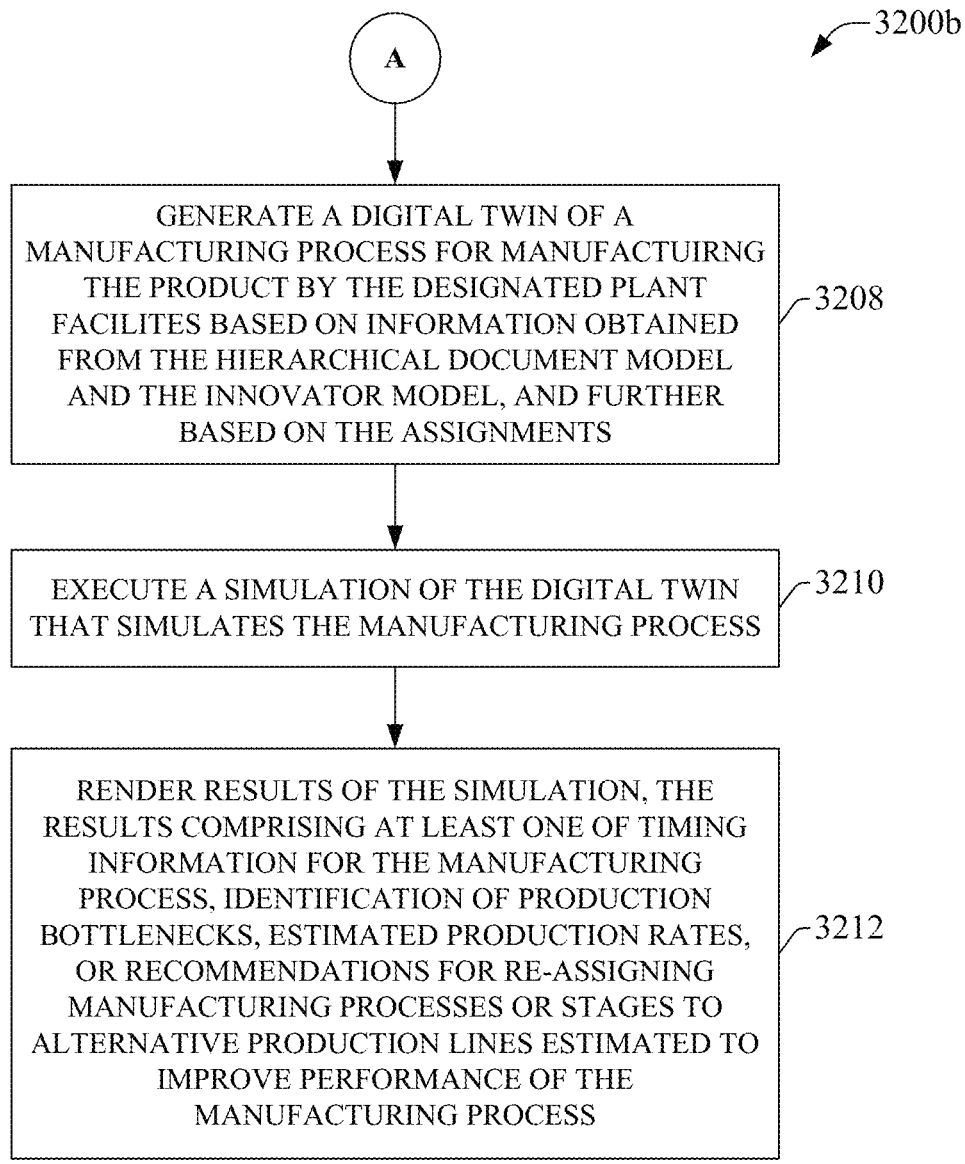
FIG. 32b is a flowchart of a second part of the example methodology for generating and simulating a digital twin of a manufacturing process based on information obtained from a translated technology transfer document.

The methodology then proceeds to the second part 3200b illustrated in FIG. 32b. At 3208, a digital twin is generated based on information obtained from the document model and the innovator model, and further based on the assignments defined at step 3206. The digital twin is a simulation-capable model of a manufacturing process for manufacturing the product by the designated plant facilities. At 3210, a simulation of the digital twin is executed. The simulation simulates the manufacturing process by simulating execution of the steps of the manufacturing process defined on the document model by the respective plant facilities to which those steps have been assigned at step 3206. The simulation can take into consideration information about the industrial equipment that make up the production lines that are to execute the steps, as obtained from the innovator model, as well as the operations required of the equipment as determined from the steps defined in the document model. The digital twin can also be configured to simulate execution of the relevant plant equipment as configured in accordance with any control or process parameters defined by the original technology transfer document.

At 3212, results of the simulation are rendered on a client device. These results can include at least one of timing information for the manufacturing process, identification of production bottlenecks, estimated production rates, recommendations for re-assigning specified manufacturing processes or stages to alternative production lines that are estimated to improve performance of the manufacturing process, or other such simulation results.

Embodiments, systems, and components described herein, as well as control systems and automation environments in which various aspects set forth in the subject specification can be carried out, can include computer or network components such as servers, clients, programmable logic controllers (PLCs), automation controllers, communications modules, mobile computers, on-board computers for mobile vehicles, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including Device-Net, ControlNet, safety networks, and EtherNet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 33:
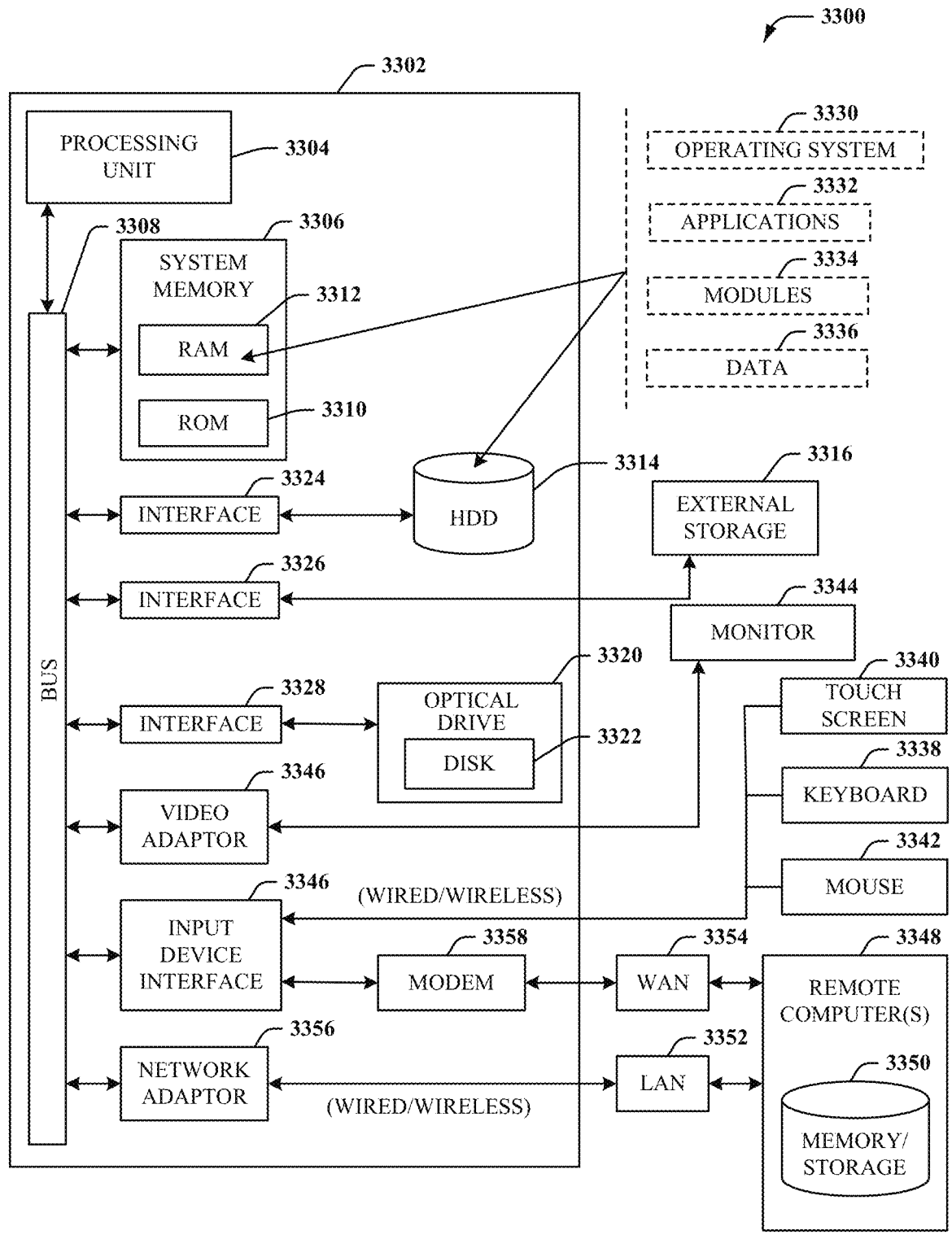
FIG. 33 is an example computing environment.
Figure 34:
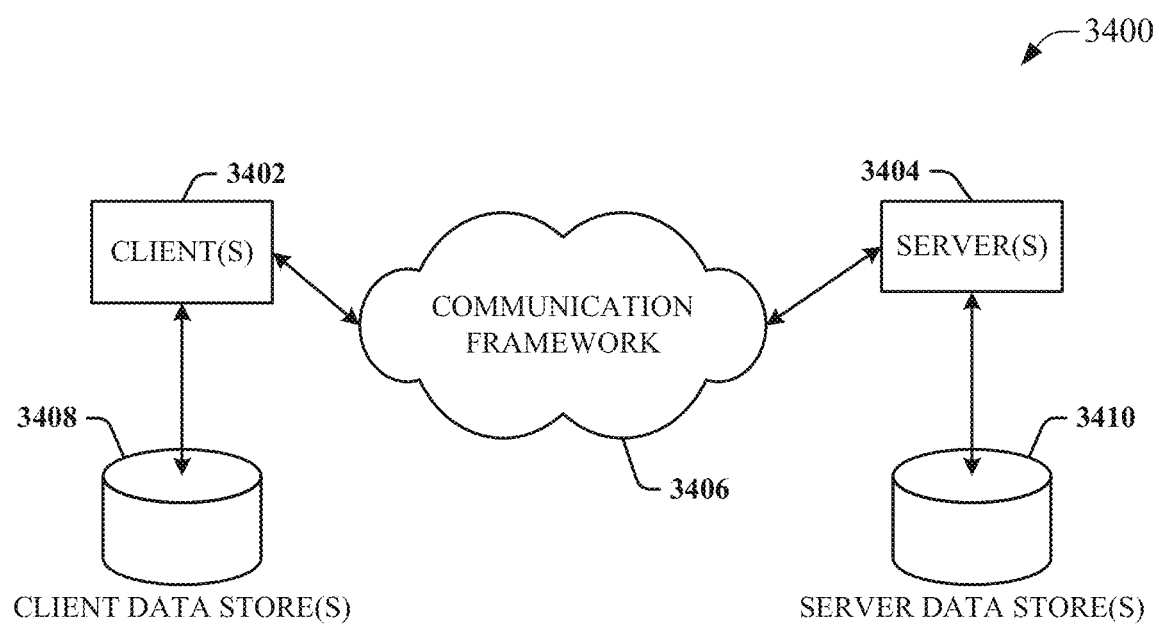
FIG. 34 is an example networking environment.

In order to provide a context for the various aspects of the disclosed subject matter, FIGS. 33 and 34 as well as the following discussion are intended to provide a brief, general description of a suitable environment in which the various aspects of the disclosed subject matter may be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 33, the example environment 3300 for implementing various embodiments of the aspects described herein includes a computer 3302, the computer 3302 including a processing unit 3304, a system memory 3306 and a system bus 3308. The system bus 3308 couples system components including, but not limited to, the system memory 3306 to the processing unit 3304. The processing unit 3304 can be any of various commercially available processors. Dual microprocessors and other multi-processor architectures can also be employed as the processing unit 3304.

The system bus 3308 can be any of several types of bus structure that can further interconnect to a memory bus (with or without a memory controller), a peripheral bus, and a local bus using any of a variety of commercially available bus architectures. The system memory 3306 includes ROM 3310 and RAM 3312. A basic input/output system (BIOS) can be stored in a non-volatile memory such as ROM, erasable programmable read only memory (EPROM), EEPROM, which BIOS contains the basic routines that help to transfer information between elements within the computer 3302, such as during startup. The RAM 3312 can also include a high-speed RAM such as static RAM for caching data.

The computer 3302 further includes an internal hard disk drive (HDD) 3314 (e.g., EIDE, SATA), one or more external storage devices 3316 (e.g., a magnetic floppy disk drive (FDD) 3316, a memory stick or flash drive reader, a memory card reader, etc.) and an optical disk drive 3320 (e.g., which can read or write from a CD-ROM disc, a DVD, a BD, etc.). While the internal HDD 3314 is illustrated as located within the computer 3302, the internal HDD 3314 can also be configured for external use in a suitable chassis (not shown). Additionally, while not shown in environment 3300, a solid state drive (SSD) could be used in addition to, or in place of, an HDD 3314. The HDD 3314, external storage device(s) 3316 and optical disk drive 3320 can be connected to the system bus 3308 by an HDD interface 3324, an external storage interface 3326 and an optical drive interface 3328, respectively. The interface 3324 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 3302, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 3312, including an operating system 3330, one or more application programs 3332, other program modules 3334 and program data 3336. All or portions of the operating system, applications, modules, and/or data can also be cached in the RAM 3312. The systems and methods described herein can be implemented utilizing various commercially available operating systems or combinations of operating systems.

Computer 3302 can optionally comprise emulation technologies. For example, a hypervisor (not shown) or other intermediary can emulate a hardware environment for operating system 3330, and the emulated hardware can optionally be different from the hardware illustrated in FIG. 33. In such an embodiment, operating system 3330 can comprise one virtual machine (VM) of multiple VMs hosted at computer 3302. Furthermore, operating system 3330 can provide runtime environments, such as the Java runtime environment or the .NET framework, for application programs 3332. Runtime environments are consistent execution environments that allow application programs 3332 to run on any operating system that includes the runtime environment. Similarly, operating system 3330 can support containers, and application programs 3332 can be in the form of containers, which are lightweight, standalone, executable packages of software that include, e.g., code, runtime, system tools, system libraries and settings for an application.

Further, computer 3302 can be enable with a security module, such as a trusted processing module (TPM). For instance with a TPM, boot components hash next in time boot components, and wait for a match of results to secured values, before loading a next boot component. This process can take place at any layer in the code execution stack of computer 3302, e.g., applied at the application execution level or at the operating system (OS) kernel level, thereby enabling security at any level of code execution.

A user can enter commands and information into the computer 3302 through one or more wired/wireless input devices, e.g., a keyboard 3338, a touch screen 3340, and a pointing device, such as a mouse 3342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 3304 through an input device interface 3344 that can be coupled to the system bus 3308, but can be connected by other interfaces, such as a parallel port, an IEEE 1394 serial port, a game port, a USB port, an IR interface, a BLUETOOTH® interface, etc.

A monitor 3344 or other type of display device can be also connected to the system bus 3308 via an interface, such as a video adapter 3348. In addition to the monitor 3344, a computer typically includes other peripheral output devices (not shown), such as speakers, printers, etc.

The computer 3302 can operate in a networked environment using logical connections via wired and/or wireless communications to one or more remote computers, such as a remote computer(s) 3348. The remote computer(s) 3348 can be a workstation, a server computer, a router, a personal computer, portable computer, microprocessor-based entertainment appliance, a peer device or other common network node, and typically includes many or all of the elements described relative to the computer 3302, although, for purposes of brevity, only a memory/storage device 3350 is illustrated. The logical connections depicted include wired/wireless connectivity to a local area network (LAN) 3352 and/or larger networks, e.g., a wide area network (WAN) 3354. Such LAN and WAN networking environments are commonplace in offices and companies, and facilitate enterprise-wide computer networks, such as intranets, all of which can connect to a global communications network, e.g., the Internet.

When used in a LAN networking environment, the computer 3302 can be connected to the local network 3352 through a wired and/or wireless communication network interface or adapter 3356. The adapter 3356 can facilitate wired or wireless communication to the LAN 3352, which can also include a wireless access point (AP) disposed thereon for communicating with the adapter 3356 in a wireless mode.

When used in a WAN networking environment, the computer 3302 can include a modem 3358 or can be connected to a communications server on the WAN 3354 via other means for establishing communications over the WAN 3354, such as by way of the Internet. The modem 3358, which can be internal or external and a wired or wireless device, can be connected to the system bus 3308 via the input device interface 3346. In a networked environment, program modules depicted relative to the computer 3302 or portions thereof, can be stored in the remote memory/storage device 3350. It will be appreciated that the network connections shown are example and other means of establishing a communications link between the computers can be used.

When used in either a LAN or WAN networking environment, the computer 3302 can access cloud storage systems or other network-based storage systems in addition to, or in place of, external storage devices 3316 as described above. Generally, a connection between the computer 3302 and a cloud storage system can be established over a LAN 3352 or WAN 3354 e.g., by the adapter 3356 or modem 3358, respectively. Upon connecting the computer 3302 to an associated cloud storage system, the external storage interface 3326 can, with the aid of the adapter 3356 and/or modem 3358, manage storage provided by the cloud storage system as it would other types of external storage. For instance, the external storage interface 3326 can be configured to provide access to cloud storage sources as if those sources were physically connected to the computer 3302.

The computer 3302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

FIG. 34 is a schematic block diagram of a sample computing environment 3400 with which the disclosed subject matter can interact. The sample computing environment 1500 includes one or more client(s) 3402. The client(s) 3402 can be hardware and/or software (e.g., threads, processes, computing devices). The sample computing environment 3400 also includes one or more server(s) 3404. The server(s) 3404 can also be hardware and/or software (e.g., threads, processes, computing devices). The servers 3404 can house threads to perform transformations by employing one or more embodiments as described herein, for example. One possible communication between a client 3402 and servers 3404 can be in the form of a data packet adapted to be transmitted between two or more computer processes. The sample computing environment 3400 includes a communication framework 3406 that can be employed to facilitate communications between the client(s) 3402 and the server(s) 3404. The client(s) 3402 are operably connected to one or more client data store(s) 3408 that can be employed to store information local to the client(s) 1502. Similarly, the server(s) 3404 are operably connected to one or more server data store(s) 3410 that can be employed to store information local to the servers 3404.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:
1. A system, comprising:
 a processor, operatively coupled to a memory, that executes executable components stored on the memory, the executable components comprising:
 a user interface component configured to import a technology transfer document containing informa- tion about a product to be manufactured and describing a manufacturing process for manufacturing the product;
a conversion component configured to translate the technology transfer document to a package model, the package model comprising a hierarchically structured organization of nodes representing content sections of the technology transfer document;
a digital twin generator component configured to generate a digital twin of the manufacturing process based on information contained in the package model; and
a simulation component configured to execute a simulation of the manufacturing process based on the digital twin and to generate simulation result data indicating results of the simulation.

2. The system of claim 1, wherein the nodes of the package model are organized according to a hierarchy of levels comprising one or more of a process level representing a manufacturing process, a stage level representing stages of the manufacturing process, a step level representing steps of the stages, or a parameter level representing control parameter values associated with the steps.

3. The system of claim 1, wherein
the user interface component is configured to receive assignment data that assigns a manufacturing step represented as a node of the package model to a production line defined in the system, and
the digital twin generator component is configured to generate the digital twin based on information about the manufacturing step retrieved from the package model and capability information for industrial equipment registered for the production line.

4. The system of claim 3, further comprising a model builder component configured to integrate the package model into an innovator model based on the assignment data,
wherein
the innovator model defines an ecosystem of plant facilities, and
nodes of the innovator model are organized according to a hierarchy of levels comprising one or more of a technology owner level, a manufacturer level, a plant level, a production line level, or a packages level.

5. The system of claim 4, wherein
the innovator model defines production lines that are available at the plant facilities and manufacturing capabilities of the production lines, and
the digital twin generator component is configured to obtain the capability information for the industrial equipment from the innovator model.

6. The system of claim 3, wherein
the package model defines multiple stages of the manufacturing process,
the assignment data assigns a first stage of the multiple stages to a first production line defined in the system and assigns a second stage of the multiple stages to a second production line defined in the system, and
the digital twin generator component generates the digital twin to simulate execution of the first stage on the first production line and execution of the second stage on the second production line.

7. The system of claim 1, wherein the results of the simulation comprise at least one of a timing of the manufacturing process, identification of a predicted congestion of product flow, a product quality prediction, or a product throughput prediction.

8. The system of claim 1, wherein the result data comprises a recommendation for altering the manufacturing process in a manner predicted to bring a performance metric for the manufacturing process within a defined range of acceptability.

9. The system of claim 1, wherein the technology transfer document is imported as at least one of a portable document format file, a word processing file, or an image file.

10. The system of claim 1, further comprising an export component configured to translate information about the manufacturing process contained in the package model to control configuration data and to export the control configuration data to an industrial device or system,
wherein the control configuration data configures the industrial device or system to execute a portion of the manufacturing process.

11. A method, comprising:
importing, by a system comprising a processor, a technology transfer document containing information about a product to be manufactured and describing a manufacturing process for manufacturing the product;
converting, by the system, the technology transfer document to a package model, the package model comprising a hierarchically structured organization of objects representing content sections of the technology transfer document;
generating, by the system, a digital twin of the manufacturing process based on information contained in the package model;
executing, by the system, a simulation of the manufacturing process based on the digital twin; and
generating, by the system, simulation result data indicating results of the simulation.

12. The method of claim 11, wherein the nodes of the package model are organized according to a hierarchy of levels comprising one or more of a process level representing a manufacturing process, a stage level representing stages of the manufacturing process, a step level representing steps of the stages, or a parameter level representing control parameter values associated with the steps.

13. The method of claim 11, further comprising receiving, by the system via interaction with a dashboard interface, assignment data that assigns a manufacturing step represented as a node of the package model to a production line defined in the system,
wherein the generating of the digital twin comprises generating the digital twin based on information about the manufacturing step retrieved from the package model and capability information for industrial equipment registered for the production line.

14. The method of claim 13, further comprising integrating, by the system, the package model into an innovator model based on the assignment data,
wherein
the innovator model defines an ecosystem of plant facilities, and
nodes of the innovator model are organized according to a hierarchy of levels comprising one or more of a technology owner level, a manufacturer level, a plant level, a production line level, or a packages level.

15. The method of claim 14, wherein
the innovator model defines production lines that are available at the plant facilities and manufacturing capabilities of the production lines, and
the generating of the digital twin comprises obtaining the capability information for the industrial equipment from the innovator model.

16. The method of claim 13, wherein
the package model defines multiple stages of the manufacturing process,
the assignment data assigns a first stage of the multiple stages to a first production line defined in the system and assigns a second stage of the multiple stages to a second production line defined in the system, and
the generating of the digital twin comprises generating the digital twin to simulate execution of the first stage on the first production line and execution of the second stage on the second production line.

17. The system of claim 11, wherein the results of the simulation comprise at least one of a timing of the manufacturing process, identification of a predicted congestion of product flow, a product quality prediction, or a product throughput prediction.

18. The system of claim 11, wherein the result data comprises a recommendation for altering the manufacturing process in a manner predicted to bring a performance metric for the manufacturing process within a defined range of acceptability.

19. A non-transitory computer-readable medium having stored thereon instructions that, in response to execution, cause a technology transfer system comprising a processor to perform operations, the operations comprising:

importing a technology transfer document comprising information describing a product to be manufactured and a manufacturing process for manufacturing the product;
translating the technology transfer document to a package model, wherein the package model comprises a hierarchically structured organization of nodes representing content sections of the technology transfer document;
generating a digital twin of the manufacturing process based on information contained in the package model;
executing a simulation of the manufacturing process based on the digital twin; and
generating simulation result data indicating results of the simulation.

20. The non-transitory computer-readable medium of claim 19, further comprising receiving, via interaction with a dashboard interface, assignment data that assigns a manufacturing step represented as a node of the package model to a production line defined in the system,
wherein the generating of the digital twin comprises generating the digital twin based on information about the manufacturing step retrieved from the package model and capability information for industrial equipment registered for the production line.

* * * * *